(12) United States Patent  
Ritter et al.

(10) Patent No.: US 9,093,974 B2  
(45) Date of Patent: Jul. 28, 2015

(54) ELECTROMAGNETIC INTERFERENCE FILTER FOR IMPLANTED ELECTRONICS

(71) Applicant: AVX Corporation, Fountain Inn, SC (US)

(72) Inventors: Andrew P. Ritter, Simpsonville, SC (US); Richard J. Panlener, Valencia, CA (US); Sam Eldawoudy, Myrtle Beach, SC (US); Kimberly Van Alstine, Murrells Inlet, SC (US)

(73) Assignee: AVX Corporation, Fountain Inn, SC (US)

( * ) Notice: Subject to any disclaimer, the term of this patent is extended or adjusted under 35 U.S.C. 154(b) by 0 days.

(21) Appl. No.: 14/013,307

(22) Filed: Aug. 29, 2013

(65) Prior Publication Data

US 2014/0062618 A1   Mar. 6, 2014

Related U.S. Application Data

(60) Provisional application No. 61/696,844, filed on Sep. 5, 2012.

(51) Int. Cl.
```
H03H 7/00     (2006.01)
H03H 7/01     (2006.01)
H03H 1/00     (2006.01)
```
(52) U.S. Cl.
CPC ........... *H03H 7/0138* (2013.01); *H03H 1/0007* (2013.01)

(58) Field of Classification Search
CPC ............ H03H 1/0007; H01R 13/7197; H01R 13/719; H01R 13/7195; H01G 4/35

USPC ....................... 361/301.1, 302; 333/182, 185
See application file for complete search history.

(56) References Cited

U.S. PATENT DOCUMENTS

| | | | |
|---|---|---|---|
| 3,681,612 A | 8/1972 | Vogl et al. | |
| 3,745,430 A | 7/1973 | Lunquist et al. | |
| 4,424,551 A | 1/1984 | Stevenson et al. | |
| 4,831,494 A * | 5/1989 | Arnold et al. | 361/306.3 |
| 5,039,965 A | 8/1991 | Higgins, Jr. | |

(Continued)

FOREIGN PATENT DOCUMENTS

| | | |
|---|---|---|
| JP | 06-176962 | 6/1994 |
| JP | 2001-068958 | 3/2001 |

(Continued)

OTHER PUBLICATIONS

English Abstract of JP 06-176962.

(Continued)

*Primary Examiner* — Quan Tra  
(74) *Attorney, Agent, or Firm* — Dority & Manning, P.A.

(57) ABSTRACT

An electromagnetic interference filter for various electronic devices such as implantable medical devices is provided. A plurality of signal electrodes can be configured in an array, where each signal electrode extends vertically from a top surface to a bottom surface of the filter such that the signal electrodes are flush with the top and bottom surface. Ground or common electrodes can have a parallel arrangement and be interposed between the signal electrodes. The ground electrodes can be grounded internally, externally, or both internally and externally. Dielectric material can be disposed between signal electrodes and ground electrodes to act as an insulator between adjacent electrodes.

22 Claims, 19 Drawing Sheets

(56) References Cited

U.S. PATENT DOCUMENTS

| | | |
|---|---|---|
| 5,268,810 A | 12/1993 | DiMarco et al. |
| 5,331,505 A | 7/1994 | Wilheim |
| 5,333,095 A | 7/1994 | Stevenson et al. |
| 5,450,090 A | 9/1995 | Gels et al. |
| 5,491,300 A | 2/1996 | Huppenthal et al. |
| 5,493,259 A | 2/1996 | Blalock et al. |
| 5,620,476 A | 4/1997 | Truex et al. |
| 5,650,759 A | 7/1997 | Hittman et al. |
| 5,683,435 A | 11/1997 | Truex et al. |
| 5,757,252 A | 5/1998 | Cho et al. |
| 5,759,197 A | 6/1998 | Sawchuk et al. |
| 5,765,779 A | 6/1998 | Hancock et al. |
| 5,782,891 A | 7/1998 | Hassler et al. |
| 5,822,174 A | 10/1998 | Yamate et al. |
| 5,896,267 A | 4/1999 | Hittman et al. |
| 5,905,627 A | 5/1999 | Brendel et al. |
| 5,929,729 A | 7/1999 | Swarup |
| 5,959,336 A | 9/1999 | Barsan |
| 5,959,829 A | 9/1999 | Stevenson et al. |
| 5,973,906 A | 10/1999 | Stevenson et al. |
| 5,973,907 A | 10/1999 | Reed |
| 5,999,398 A | 12/1999 | Makl et al. |
| 6,018,448 A | 1/2000 | Anthony |
| 6,097,581 A | 8/2000 | Anthony |
| 6,137,161 A | 10/2000 | Gilliland et al. |
| 6,146,743 A | 11/2000 | Haq et al. |
| 6,157,528 A | 12/2000 | Anthony |
| 6,282,074 B1 | 8/2001 | Anthony |
| 6,285,542 B1 | 9/2001 | Kennedy, III et al. |
| 6,292,351 B1 * | 9/2001 | Ahiko et al. ............... 361/306.3 |
| 6,324,047 B1 | 11/2001 | Hayworth |
| 6,373,673 B1 | 4/2002 | Anthony |
| 6,388,856 B1 | 5/2002 | Anthony |
| 6,424,234 B1 | 7/2002 | Stevenson |
| 6,456,481 B1 | 9/2002 | Stevenson |
| 6,459,935 B1 | 10/2002 | Piersma |
| 6,469,595 B2 | 10/2002 | Anthony et al. |
| 6,473,314 B1 | 10/2002 | Custer et al. |
| 6,496,355 B1 * | 12/2002 | Galvagni et al. ............ 361/306.3 |
| 6,498,710 B1 | 12/2002 | Anthony |
| 6,509,807 B1 | 1/2003 | Anthony et al. |
| 6,512,666 B1 | 1/2003 | Duva |
| 6,522,516 B2 | 2/2003 | Anthony |
| 6,529,103 B1 | 3/2003 | Brendel et al. |
| 6,549,389 B2 | 4/2003 | Anthony et al. |
| 6,563,688 B2 | 5/2003 | Anthony et al. |
| 6,566,978 B2 | 5/2003 | Stevenson et al. |
| 6,580,595 B2 | 6/2003 | Anthony et al. |
| 6,594,128 B2 | 7/2003 | Anthony |
| 6,603,646 B2 | 8/2003 | Anthony et al. |
| 6,606,011 B2 | 8/2003 | Anthony et al. |
| 6,636,406 B1 | 10/2003 | Anthony |
| 6,650,525 B2 | 11/2003 | Anthony |
| 6,660,116 B2 | 12/2003 | Wolf et al. |
| 6,687,108 B1 | 2/2004 | Anthony et al. |
| 6,738,249 B1 | 5/2004 | Anthony et al. |
| 6,765,680 B2 | 7/2004 | Carr et al. |
| 6,765,779 B2 | 7/2004 | Stevenson et al. |
| 6,765,780 B2 | 7/2004 | Brendel et al. |
| 6,768,630 B2 | 7/2004 | Togashi |
| 6,806,806 B2 | 10/2004 | Anthony |
| 6,888,715 B2 | 5/2005 | Stevenson et al. |
| 7,012,192 B2 | 3/2006 | Stevenson et al. |
| 7,038,900 B2 | 5/2006 | Stevenson et al. |
| 7,110,227 B2 | 9/2006 | Anthony et al. |
| 7,113,387 B2 | 9/2006 | Stevenson et al. |
| 7,199,995 B2 | 4/2007 | Stevenson |
| 7,236,834 B2 | 6/2007 | Christopherson et al. |
| 7,301,748 B2 | 11/2007 | Anthony et al. |
| 7,310,216 B2 | 12/2007 | Stevenson et al. |
| 7,322,832 B2 | 1/2008 | Kronich et al. |
| 7,327,553 B2 | 2/2008 | Brendel |
| 7,363,090 B2 | 4/2008 | Halperin |
| 7,423,860 B2 | 9/2008 | Anthony et al. |
| 7,428,136 B2 | 9/2008 | Barnett |
| 7,433,168 B2 | 10/2008 | Anthony |
| 7,436,672 B2 | 10/2008 | Ushijima et al. |
| 7,439,449 B1 | 10/2008 | Kumar et al. |
| 7,446,996 B2 | 11/2008 | Togashi |
| 7,450,396 B2 | 11/2008 | Ye et al. |
| 7,495,884 B2 | 2/2009 | Togashi |
| 7,586,728 B2 | 9/2009 | Anthony |
| 7,593,208 B2 | 9/2009 | Anthony et al. |
| 7,623,335 B2 * | 11/2009 | Stevenson et al. ............ 361/302 |
| 7,675,729 B2 | 3/2010 | Anthony et al. |
| 7,679,926 B2 | 3/2010 | Hsu et al. |
| 7,697,262 B2 * | 4/2010 | Ritter et al. ................. 361/306.1 |
| 7,702,387 B2 | 4/2010 | Stevenson et al. |
| 7,719,854 B2 | 5/2010 | Youker et al. |
| 7,733,621 B2 | 6/2010 | Anthony et al. |
| 7,889,020 B2 | 2/2011 | Hock et al. |
| 7,961,453 B2 * | 6/2011 | Lee et al. .................... 361/306.3 |
| 8,195,295 B2 | 6/2012 | Stevenson |
| 8,422,195 B2 | 4/2013 | Stevenson |
| 2003/0179536 A1 | 9/2003 | Stevenson et al. |
| 2004/0027771 A1 | 2/2004 | Anthony |
| 2004/0032304 A1 | 2/2004 | Anthony et al. |
| 2005/0180091 A1 | 8/2005 | Hayworth et al. |
| 2005/0201039 A1 | 9/2005 | Stevenson et al. |
| 2005/0219787 A1 | 10/2005 | Stevenson et al. |
| 2006/0032665 A1 | 2/2006 | Ice |
| 2006/0085043 A1 | 4/2006 | Stevenson |
| 2006/0212096 A1 | 9/2006 | Stevenson |
| 2007/0085630 A1 | 4/2007 | Hock et al. |
| 2007/0112398 A1 | 5/2007 | Stevenson |
| 2007/0123949 A1 | 5/2007 | Dabney et al. |
| 2007/0203529 A1 | 8/2007 | Iyer et al. |
| 2007/0288058 A1 | 12/2007 | Halperin et al. |
| 2008/0049376 A1 | 2/2008 | Stevenson |
| 2008/0049410 A1 | 2/2008 | Kawaguchi et al. |
| 2008/0071313 A1 | 3/2008 | Stevenson |
| 2008/0116997 A1 | 5/2008 | Dabney |
| 2008/0132987 A1 | 6/2008 | Westlund |
| 2008/0158746 A1 | 7/2008 | Anthony et al. |
| 2008/0161886 A1 | 7/2008 | Stevenson |
| 2008/0195180 A1 | 8/2008 | Stevenson et al. |
| 2008/0239622 A1 | 10/2008 | Hsu et al. |
| 2008/0247111 A1 | 10/2008 | Anthony et al. |
| 2008/0247116 A1 | 10/2008 | Kawano et al. |
| 2008/0247117 A1 | 10/2008 | Elam et al. |
| 2008/0264685 A1 | 10/2008 | Park et al. |
| 2008/0277153 A1 | 11/2008 | Teshome et al. |
| 2009/0097219 A1 | 4/2009 | Cho et al. |
| 2009/0107717 A1 | 4/2009 | Hsu et al. |
| 2009/0128976 A1 | 5/2009 | Anthony |
| 2009/0139760 A1 | 6/2009 | Tanaka |
| 2009/0180237 A1 | 7/2009 | Hou et al. |
| 2009/0187229 A1 | 7/2009 | Lavie |
| 2009/0236141 A1 | 9/2009 | Kim et al. |
| 2009/0243756 A1 | 10/2009 | Stevenson et al. |
| 2010/0023000 A1 | 1/2010 | Stevenson et al. |
| 2010/0046135 A1 | 2/2010 | Niki et al. |
| 2010/0046137 A1 | 2/2010 | Adachi |
| 2010/0109958 A1 | 5/2010 | Haubrich et al. |
| 2010/0109966 A1 | 5/2010 | Mateychuk et al. |
| 2010/0149042 A1 | 6/2010 | Utsi et al. |
| 2010/0151113 A1 | 6/2010 | Shelton |
| 2010/0321860 A1 * | 12/2010 | Osawa ......................... 361/303 |
| 2011/0090665 A1 | 4/2011 | Korony et al. |
| 2011/0147062 A1 | 6/2011 | Stevenson |
| 2012/0314338 A1 * | 12/2012 | Togashi ...................... 361/306.3 |

FOREIGN PATENT DOCUMENTS

| | | |
|---|---|---|
| JP | 2004-254257 | 9/2004 |
| JP | 2004-289760 | 10/2004 |
| JP | 2005-117606 | 4/2005 |
| JP | 2007-129565 | 5/2007 |

OTHER PUBLICATIONS

Machine translation of JP 06-176962.
English Abstract of JP 2001-068958.
Machine translation of JP 2001-068958.

(56) References Cited

OTHER PUBLICATIONS

Enghsh Abstract of JP 2004-254257.
Machine translation of JP 2004-254257.
English Abstract of JP 2004-289760.
Machine translation of JP 2004-289760.
English Abstract of JP 2005-117606.
Machine translation of JP 2005-117606.
English Abstract of JP 2007-129565.
Machine translation of JP 2007-129565.

* cited by examiner

ELECTROMAGNETIC INTERFERENCE FILTER FOR IMPLANTED ELECTRONICS

PRIORITY

This application claims the benefit of previously filed U.S. Provisional Patent Application entitled "ELECTROMAGNETIC INTERFERENCE FILTER FOR IMPLANTED ELECTRONICS," assigned U.S. Ser. No. 61/696,844, filed Sep. 5, 2012, and which is incorporated herein by reference for all purposes.

FIELD OF THE SUBJECT MATTER

The presently disclosed subject matter relates in general to device input and output filtering, and more particularly to electromagnetic interference filters for implantable medical devices.

BACKGROUND OF THE SUBJECT MATTER

Heart pacemakers and other implantable medical devices include electronic components contained within an outer housing. The outer housing of the implantable medical device can be formed of an appropriate material to withstand implantation within a human body. Implantable electronics can be shielded from external sources of electromagnetic interference (EMI) using a filter.

Conventionally, a feed-through filter can be coupled to an implantable medical device such that feed wires of the device pass through the feed-through filter as close as practical to the to the input-output connector on the implanted device. For example, as illustrated in FIGS. 38 and 39, a conventional implantable system 10 can include a canister or ferrule 11 through which feed wires 12 pass in order to connect between external circuitry of an implanted device and internal circuitry of the implanted device. The canister 11 can include a bushing 13 to secure and protect the feed wires 12. Bonding material 14 can be used to secure the feed wires 12 in the canister 11.

A feed-though filter 15 can be disposed within the canister 11. Feed wires 12 completely pass through feed-through filter 15 to connect between the internal and external circuitry of the implanted device. The feed-through filter 15 can act as a capacitor such that the each of the feed wires 12 of the device is electrically connected to a respective set of electrode plates 16 and 17 within the feed-through filter by the electrically conductive via 18. Conductive plates 17 are interleaved between conductive plates 16 to produce the capacitance effect. However, such feed-through filters often require numerous intricate manufacturing steps and are susceptible to damage during manufacture and assembly prior to implantation.

Thus, a need exists for an improved electromagnetic interference filter for implantable medical devices. More particularly, it would be desirable to have a filter that can reduce manufacturing time, cost, and complexity while also improving installation reliability. While various implementations of electromagnetic interference filters for implantable medical devices have been developed, no design has emerged that generally encompasses all of the desired characteristics as hereafter presented in accordance with the subject technology.

SUMMARY OF THE SUBJECT MATTER

The presently disclosed subject matter recognizes and addresses various of the foregoing issues, and others concerning certain aspects of filtering devices. Thus, broadly speaking, an object of certain embodiments of the presently disclosed technology is to provide improved designs for certain components and component assemblies associated with filtering devices, and more particularly to provide improved electromagnetic interference filters for implantable medical devices.

Aspects and advantages of the presently disclosed subject matter will be set forth in part in the following description, or may be apparent from the description, or may be learned through practice of the presently disclosed subject matter, which relates in some presently disclosed embodiments to an improved electromagnetic interference filter for various electronic devices such as implantable medical devices.

In other presently disclosed embodiments, an electromagnetic interference filter can include a plurality of signal electrodes configured in an array, where each signal electrode extends vertically from a top surface to a bottom surface of the filter such that the signal electrodes are flush with the top and bottom surface. Metallization can be applied to selected regions on the top and bottom surface as to connect pluralities of signal electrodes and provide an interconnection surface for electrically attaching the filter to other components.

In presently disclosed variations of the foregoing, ground or common electrodes can be arranged parallel to and interposed between the signal electrodes. The common electrodes can be separated from the signal electrodes by a layer of dielectric, insulating, material. Alternatively, the ground electrodes can be grounded internally, that is, exposed and connected at a location on the top and/or bottom surface, or externally, that is, exposed and connected at a location on the perimeter (side) surface, or both internally and externally. Metallization can be applied to selected regions on the top, bottom and/or perimeter surfaces as to connect pluralities of ground electrodes and provide an interconnection surface for electrically attaching the filter to other components.

One exemplary embodiment of the presently disclosed subject matter relates to an electromagnetic interference filter, comprising a plurality of signal electrodes arranged in an array, adapted to be coupled on a first surface of the filter to internal conductors of an implantable medical device and coupled on an opposite surface of the filter to external lead wires implanted within a body in which such medical device is implanted; a plurality of ground electrodes arranged in parallel and interposed between the signal electrodes, such ground electrodes grounded at least one of internally and externally; and dielectric material disposed between the signal electrodes and ground electrodes to act as insulator material between adjacent electrodes. In such exemplary arrangement, preferably the filter acts as a shielding element to prevent unwanted electromagnetic interference with the input and output of an associated implanted medical device.

In certain such exemplary embodiments, such an electromagnetic interference filter may further include a plurality of arrays of signal electrodes; and a passivation layer on at least one of a top and bottom surface of the electromagnetic interference filter to prevent arcing between the plurality of signal electrode arrays. In others thereof, each signal electrode may extend vertically from a top surface to a bottom surface of the filter such that the signal electrodes are flush with the top and bottom surfaces of the filter.

In still other variations of the foregoing, the ground electrodes may be grounded internally by being exposed and connected at at least one location on the top and bottom surfaces of the filter. In yet others, the ground electrodes may be grounded externally by being exposed and connected at a location on a side surface of the filter. For other variations, the ground electrodes may be grounded both internally and externally.

For some other present variations of the foregoing, an exemplary electromagnetic interference filter may further include metallization applied to selected regions on the top and bottom surfaces of the filter to connect pluralities of signal electrodes and provide an interconnection surface for electrically attaching the filter to other components.

In other variations, an exemplary electromagnetic interference filter may further include metallization applied to selected regions on at least one of the top, bottom and side surfaces of the filter to connect pluralities of ground electrodes and provide an interconnection surface for electrically attaching the filter to other components.

For still other variations, a present exemplary electromagnetic interference filter may further include metallization applied to selected regions on at least one of the top, bottom and side surfaces of the filter to connect selected pluralities of electrodes and provide an interconnection surface for electrically attaching the filter to other components, with a portion of such interconnection surface exposed through the passivation layer.

For some of the foregoing exemplary embodiments, the filter may be substantially monolithic.

In other present exemplary variations, such plurality of signal electrodes may be arranged in a plurality of respective arrays, with each signal electrode flush with a top surface and a bottom surface of the filter; and each array may include a plurality of such signal electrodes arranged in parallel in a relatively densely packed configuration such that current conductivity capability is between such filter top surface and such filter bottom surface.

For still other present variations, the signal electrodes may have a preselected configuration and arrangement relative to the ground electrodes so as provide selected conductivity of an electrical signal applied to the signal electrodes or ground electrodes, and to form selected capacitance between the signal and ground electrodes, for shunting unwanted high frequency interference away from the signal electrodes.

In some of the foregoing, metallization may comprise termination surfaces coupled to the signal electrode arrays. For some of those, the termination surfaces may comprise one of a plate and connector couplers.

In other present variations, the metallization may comprise termination surfaces coupled with the ground electrodes. For some of those, the termination surfaces may comprise one of thin-film metallization and thick-film metallization.

In still other present variations, each ground electrode may be arranged in a vertical configuration such that each ground electrode is flush with a top surface and a bottom surface of the filter, and each ground electrode may further include protrusions that are exposed on at least one of the top and bottom surfaces in regions distinct from the signal electrodes; and the filter may further include a termination surface coupled to the ground electrode protrusions so that the ground electrodes are grounded internally. In certain such variations, one end of the ground electrodes may be flush with a side surface of the filter, and another termination surface may be coupled to the ground electrodes at such side surface so that the ground electrodes are also grounded externally.

In some present exemplary electromagnetic interference filters, the ground electrodes may be arranged in a vertical configuration and disposed to be coupled to the outermost of the plurality of signal electrodes, so that such ground electrodes are grounded internally. In selected variations of such, each ground electrode may be arranged in a vertical configuration and flush with a top surface and a bottom surface of the filter, and with at least one end thereof flush with at least a side surface of such filter, so that the filter is grounded externally.

For other present exemplary electromagnetic interference filters, metallization may be applied to selected regions on at least one of the top, bottom and side surfaces of the filter to connect selected pluralities of electrodes and provide an interconnection surface for electrically attaching the filter to other components; and a solder ball connection may be coupled with such interconnection surface through the passivation layer to couple a conductive element with the filter.

For some present exemplary electromagnetic interference filters, a plurality of arrays of signal electrodes may be further included, such arrays having a surface area less than the width of the filter and having an alternating arrangement.

In other present electromagnetic interference filter exemplary embodiment variations, metallization may be applied to selected regions on at least one of the top, bottom and side surfaces of the filter to connect selected pluralities of electrodes and provide an interconnection surface for electrically attaching the filter to other components; and such interconnection surface may include connections made thereto including at least one of a wire bonding, a ball-grid array coupling, a solder connection, and a castellation coupling.

Another present exemplary electromagnetic interference (EMI) filter preferably comprises a plurality of signal electrodes, a plurality of ground electrodes, dielectric material disposed between the signal electrodes and ground electrodes to act as insulator material between adjacent electrodes, a passivation layer, signal terminations, and ground terminations. In such exemplary arrangement, preferably the plurality of signal electrodes are arranged in a respective plurality of arrays, with each signal electrode extending vertically between respective top and bottom surfaces of the filter such that the signal electrodes are flush with such top and bottom surfaces. Further, preferably the plurality of ground electrodes are arranged in parallel and interposed between the signal electrodes, such ground electrodes grounded at least one of internally and externally. Yet further, preferably the passivation layer is arranged on at least one of a top and bottom surface of the EMI filter to prevent arcing between a plurality of signal electrode arrays, the signal terminations are applied to selected regions on the top and bottom surfaces of the EMI filter so as to connect pluralities of signal electrodes and provide an interconnection surface for electrically attaching a signal with the filter; and the ground terminations are applied to selected regions on at least one of the top, bottom and side surfaces of the EMI filter so as to connect pluralities of ground electrodes and provide an interconnection surface for electrically attaching ground to such filter.

In such foregoing exemplary embodiment, the signal electrodes may have a preselected configuration and arrangement relative to the ground electrodes so as to provide selected conductivity of an electrical signal applied to the signal electrodes or ground electrodes, and to form selected capacitance between the signal and ground electrodes, for shunting unwanted high frequency interference away from the signal electrodes.

Still further for some exemplary embodiments of the foregoing exemplary electromagnetic interference (EMI) filter, each ground electrode may be arranged in a vertical configuration such that each ground electrode is flush with a top surface and a bottom surface of the filter, and each ground electrode may further include protrusions that are exposed on at least one of the top and bottom surfaces in regions distinct from the signal electrodes; and such filter may further include a termination surface coupled to the ground electrode protrusions so that the ground electrodes are grounded internally.

For other of such exemplary electromagnetic interference (EMI) filter embodiments, one end of the ground electrodes may be flush with a side surface of the filter, and another termination surface may be coupled to the ground electrodes at such side surface so that the ground electrodes are also grounded externally.

Another presently disclosed exemplary embodiment relates to an electromagnetic interference (EMI) filter system for use with an implantable medical device. For such exemplary system, preferably there are provided a canister, respective pluralities of external and internal connection wires, and an EMI filter. Such canister preferably includes a bushing for enclosing at least one end of such canister, while the plurality of external connection wires are preferably arranged for passing through the bushing and coupling with an upper termination area of an EMI filter, and for connection with external circuitry of an associated implantable medical device; and the plurality of internal connection wires are arranged for coupling with a bottom termination area of the EMI filter, and for connection with internal circuitry of an associated implantable medical device. Further, such exemplary EMI filter preferably includes a plurality of signal electrodes arranged in an array, wherein each signal electrode extends from a top surface to a bottom surface of the filter such that the signal electrodes are flush with the top and bottom surfaces of the filter, a plurality of ground electrodes arranged in parallel and interposed between the signal electrodes, and arranged so as to be connected to at least one location on each of the top and bottom surfaces of the filter; and dielectric material disposed between the signal electrodes and ground electrodes to act as insulator material between adjacent electrodes. Furthermore, the upper termination area preferably comprises respective termination surfaces coupled with the signal electrodes and coupled with the ground electrodes, and the bottom termination area preferably comprises respective termination surfaces coupled with the signal electrodes and coupled with the ground electrodes, so that the filter acts as a shielding element to prevent unwanted electromagnetic interference with the input and output of an associated implanted medical device.

In variations of the foregoing presently disclosed exemplary system, bonding material may be further provided for securing the external connections wires in the bushing. In still other variations, the respective termination surfaces may comprise metallization applied to selected regions of the top and bottom surfaces of the filter.

It should be understood by those of ordinary skill in the art from the complete disclosure herewith that the presently disclosed subject matter equally relates to both filter devices/systems as well as corresponding and accompanying methodologies. One exemplary such presently disclosed methodology for use of an electromagnetic interference (EMI) filter with an implantable medical device preferably comprises the steps of providing a plurality of signal electrodes for an EMI filter, arranged in an array, coupled on a first surface of the filter to internal conductors of an implantable medical device and coupled on an opposite surface of the filter to external lead wires implanted within a body in which such medical device is implanted; providing a plurality of ground electrodes arranged in parallel and interposed between the signal electrodes, and extending through the filter between the first surface and opposite surface thereof, for grounding connections on such surfaces; and disposing dielectric material between the signal electrodes and ground electrodes to act as insulator material between adjacent electrodes, and so as to collectively form with the electrodes and dielectric material a filter which acts as a shielding element to prevent unwanted electromagnetic interference with the input and output of an associated implanted medical device.

In some instances thereof, such methodology may further include providing a plurality of arrays of signal electrodes; and forming a passivation layer on at least one of a top and bottom surface of the electromagnetic interference filter to prevent arcing between the plurality of signal electrode arrays; and grounding such ground electrodes internally and externally.

In yet other variations of present methodology, steps may further include applying metallization to selected regions on at least one of the top, bottom and side surfaces of the filter to form an interconnection surface; and using such interconnection surface to electrically connect selected pluralities of electrodes of the filter to other components, wherein such connections are made using at least one of wire bonding, ball-grid array coupling, soldering, and castellation coupling.

Additional objects and advantages of the presently disclosed subject matter are set forth in, or will be apparent to those of ordinary skill in the art from, the detailed description herein. Also, it should be further appreciated by those of ordinary skill in the art that modifications and variations to the specifically illustrated, referenced, and discussed features and/or steps hereof may be practiced in various embodiments and uses of the disclosed technology without departing from the spirit and scope thereof, by virtue of present reference thereto. Such variations may include, but are not limited to, substitution of equivalent means, steps, features, or materials for those shown, referenced, or discussed, and the functional, operational, or positional reversal of various parts, features, steps, or the like.

Still further, it is to be understood that different embodiments, as well as different presently preferred embodiments, of this technology may include various combinations or configurations of presently disclosed steps, features or elements, or their equivalents (including combinations of features, configurations, or steps thereof not expressly shown in the figures or stated in the detailed description).

BRIEF DESCRIPTION OF THE DRAWINGS

A full and enabling disclosure of the present presently disclosed subject matter, including the best mode thereof, directed to one of ordinary skill in the art, is set forth in the specification, which makes reference to the appended figures, in which.

Figure 1:
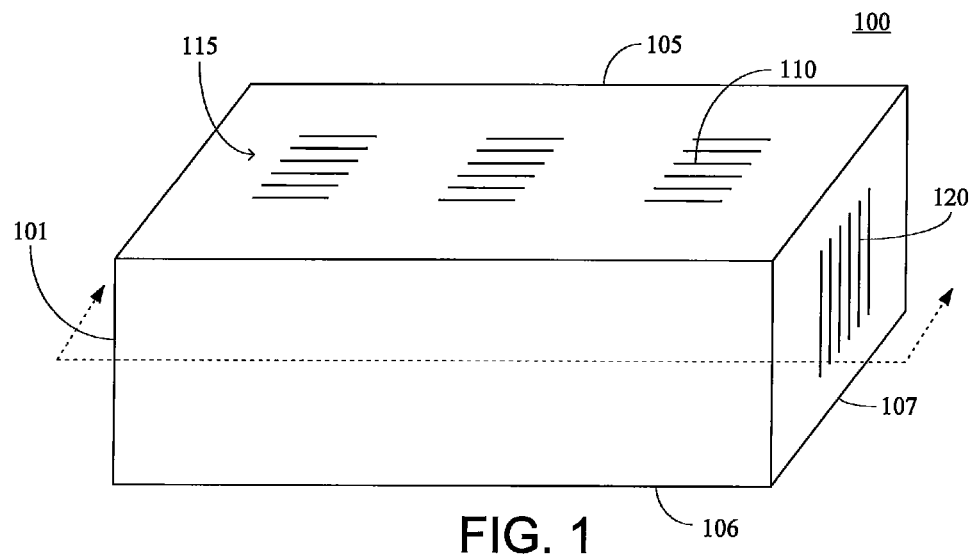
FIG. 1 provides an outer perspective view of an exemplary electromagnetic interference filter according to an exemplary embodiment of the present disclosure.

Repeat use of reference characters throughout the present specification and appended drawings is intended to represent same or analogous features, elements, or steps of the presently disclosed subject matter.

DETAILED DESCRIPTION OF THE PREFERRED EMBODIMENTS

Reference is made herewith in detail to embodiments of the presently disclosed subject matter, one or more examples of which are illustrated in the subject drawings. Each example is provided by way of explanation of the presently disclosed subject matter, not limitation of the presently disclosed subject matter. In fact, it will be apparent to those skilled in the art that various modifications and variations can be made in the present presently disclosed subject matter without departing from the scope or spirit of the presently disclosed subject matter. For instance, features illustrated or described as part of one embodiment can be used with another embodiment to yield a still further embodiment. Thus, it is intended that the present presently disclosed subject matter covers such modifications and variations as come within the scope of the broader disclosure herewith.

Generally, the present disclosure is directed to an electromagnetic interference filter for various electronic devices such as implantable medical devices. In some instances, a plurality of signal electrodes may be configured in an array, where each signal electrode extends vertically from a top surface to a bottom surface of the filter such that the signal electrodes are flush with the top and bottom surface.

An electromagnetic interference filter may include a plurality of signal electrode arrays. The signal electrodes in turn may be coupled to internal conductors of the implantable medical device on a first surface and external lead wires implanted within the body such as the heart on the opposite surface. Ground or common electrodes can be parallel to and interposed between the signal electrodes. The ground electrodes can be grounded internally, externally, or both internally and externally. Dielectric material can be disposed between signal electrodes and ground electrodes to act as an insulator between adjacent electrodes. In addition, a passivation layer can be formed on a top and/or bottom surface of the electromagnetic interference filter to prevent arching between a plurality of signal electrode arrays.

According to aspects of the present disclosure, an electromagnetic interference filter can act as a shielding element to prevent unwanted electromagnetic interference or noise from interfering with an implanted medical device. Such functionality prevents the electromagnetic interference from detrimentally affecting electronic elements of the implanted medical device. In addition, cost, complexity, and time associated with the manufacture and installation of the electromagnetic interference filter can be reduced because the filter is substantially monolithic.

Figures 36, 37:
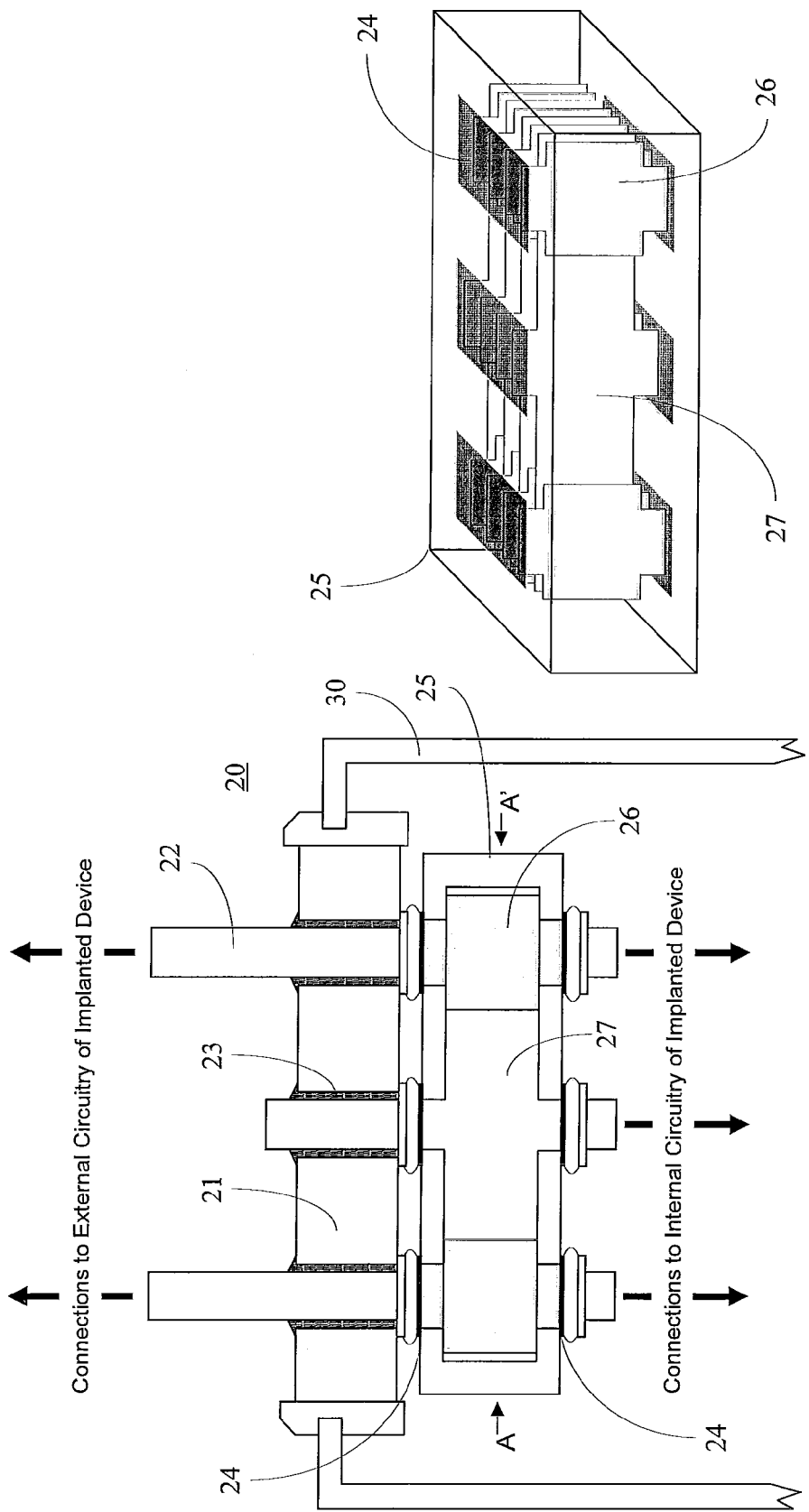
FIG. 36 provides a cross-sectional view of an exemplary implantable system according to an exemplary embodiment of the present disclosure.
FIG. 37 provides an inner perspective view, in partial see-through, of an exemplary electromagnetic interference filter according to an exemplary embodiment of the present disclosure.
Figures 38, 39:
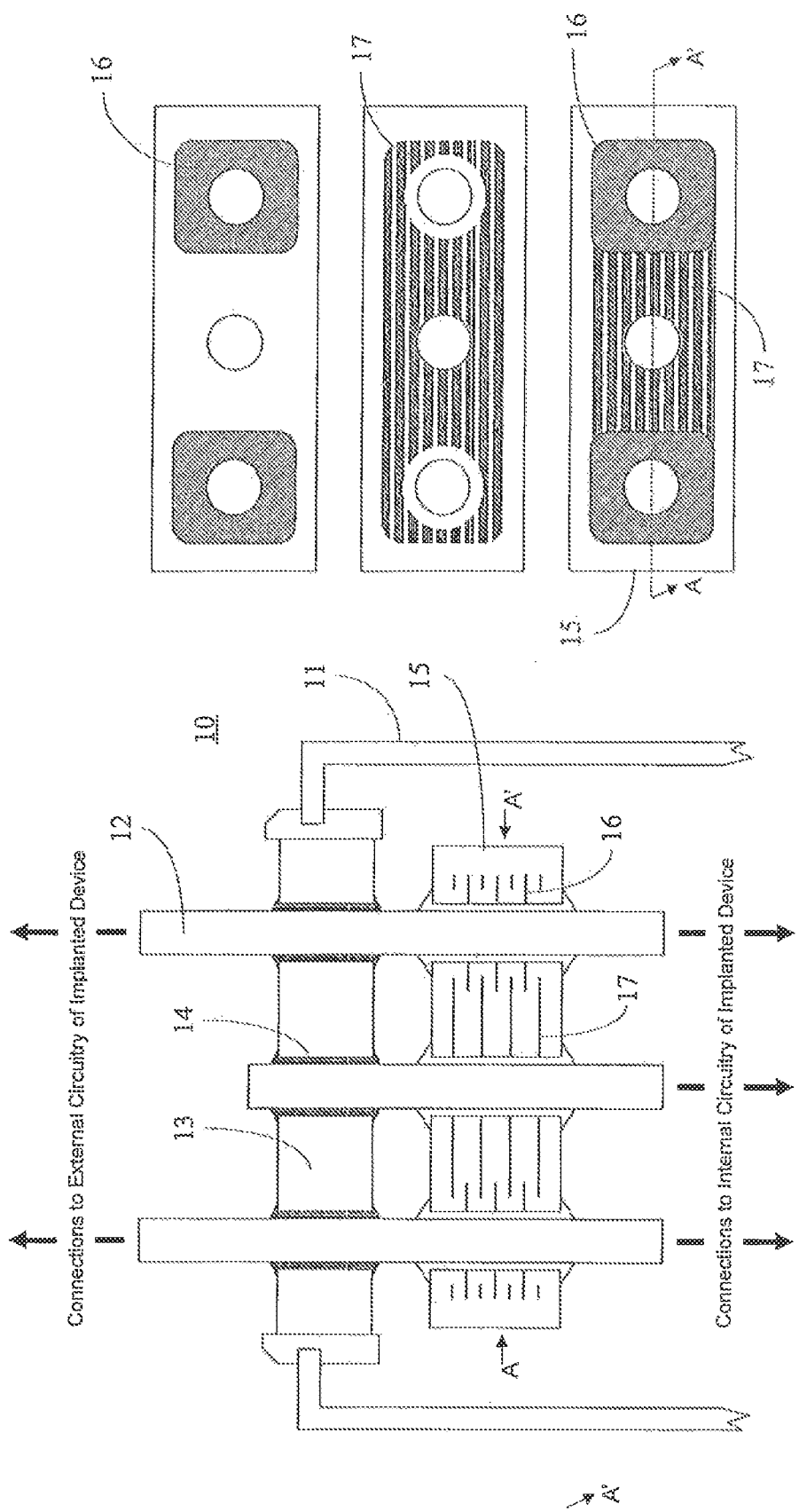
FIG. 38 provides a cross-sectional view of a conventional implantable system.
FIG. 39 provides a plurality of cross-sectional views of a conventional electromagnetic interference filter.

FIGS. 36 and 37 illustrate an implantable system 20 according to an exemplary embodiment of the present disclosure. The implantable system 20 can include a canister 30 having a bushing 21. External connection wires 22 can be secured within bushing 21 using a bonding material 23. The external connection wires 22 can pass through the bushing 21 and couple with a termination area 24 of an electromagnetic interference filter 25.

The electromagnetic interference filter 25 can include a plurality of signal electrodes 26 that extend between a top surface and a bottom surface of the filter 25. The termination regions 24 can be metallization applied to selected regions of the filter 25 to provide an interconnection surface for electrically coupling the filter 25 with other components. Common electrodes 27 can be arranged parallel to and interposed between the signal electrodes 26. The signal electrodes 26 and the common electrodes 27 can be separated by dielectric material (not shown). In addition, internal connection wires 28 can be coupled with a termination area 24 on a bottom surface of the filter 25, where the internal connection wires 28 connect the filter 15 with internal circuitry of the implanted device. As discussed below, the electromagnetic interference filter 25 can have various configurations and arrangements.

Figure 2:
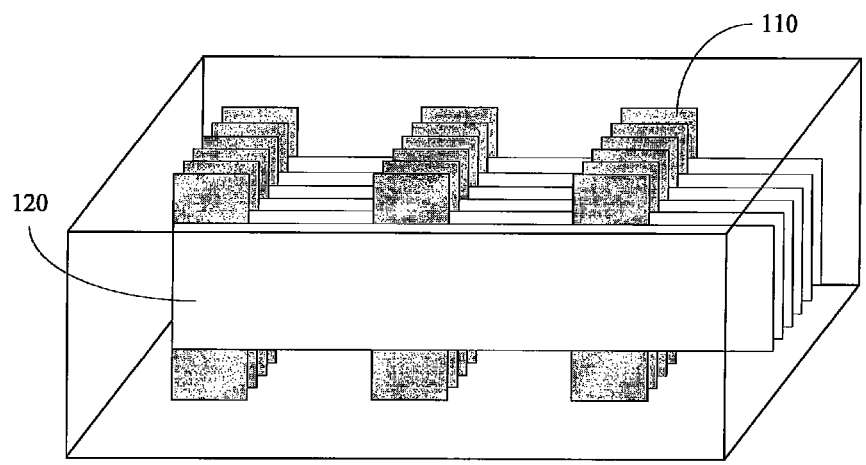
FIG. 2 provides an inner perspective view, in partial see-through, of an exemplary electromagnetic interference filter according to an exemplary embodiment of the present disclosure.
Figure 3:
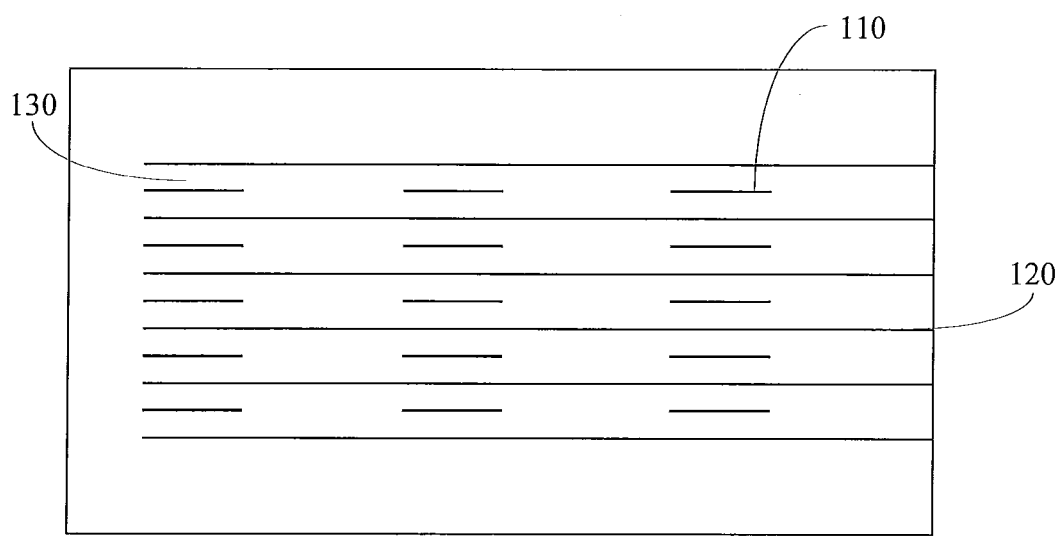
FIG. 3 provides a cross-sectional view of an exemplary electromagnetic interference filter according to an exemplary embodiment of the present disclosure.
Figure 4:
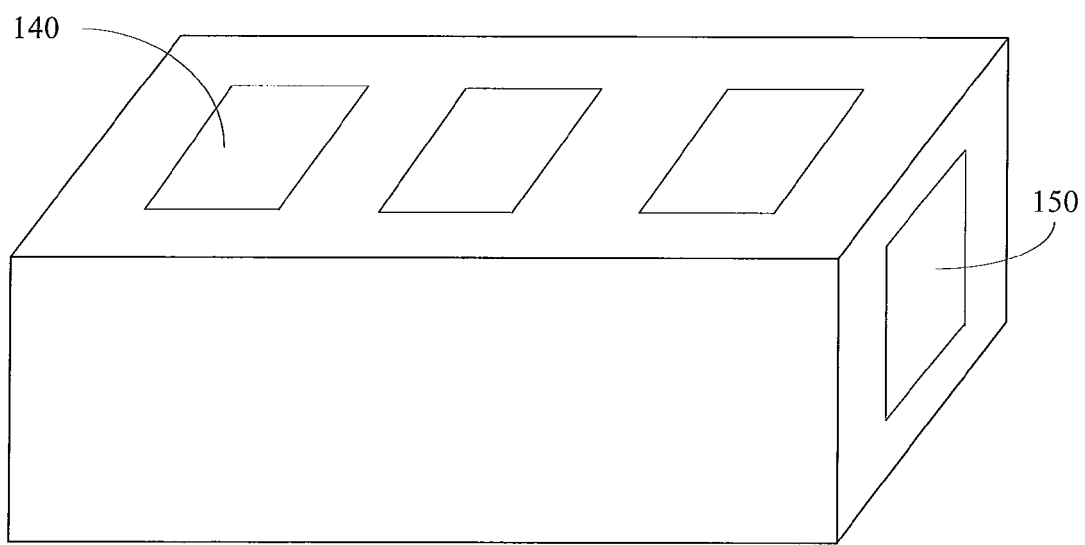
FIG. 4 provides an outer perspective view with exemplary terminations of an exemplary electromagnetic interference filter according to an exemplary embodiment of the present disclosure.

FIGS. 1-4 illustrate an exemplary electromagnetic interference filter according to an exemplary embodiment of the present disclosure. Specifically, FIG. 1 depicts an outer perspective view, FIG. 2 depicts an inner perspective view, FIG. 3 depicts a top view, and FIG. 4 depicts an outer perspective view with exemplary terminations.

Referring to FIGS. 1-4, an electromagnetic interference (EMI) filter generally 100 may be provided for filtering or shielding undesirable electromagnetic interference from an electronic device such as an implantable medical device. EMI filter 100 can include a plurality of signal electrodes 110 arranged in arrays 115. A plurality of signal electrodes 110 can be arranged in a configuration such that each signal electrode 110 is flush with a top surface 105 and a bottom surface 106 of the EMI filter. Signal electrodes 110 can be made of any electrical conductive material. Each array 115 can include a plurality of signal electrodes 110 arranged in a relatively densely packed configuration such that current conductivity capability is between the top surface 105 and the bottom surface 106 of the EMI filter 100. Any number of signal electrodes 110 can be included in each array 115. In addition, any number of arrays 115 can be included in the EMI filter 100.

A plurality of ground or common electrodes 120 can be arranged in a parallel configuration to the signal electrodes 110. The ground electrodes 120 can be interposed with the signal electrodes 110. In an embodiment of the present disclosure, one end of the ground electrodes 120 can be flush with a side surface 107 such that the EMI filter 100 can be grounded externally.

As shown in FIG. 3, the signal electrodes 110 can be arranged in a parallel configuration. Likewise, the ground electrodes 120 can also be arranged in a parallel configuration. In an embodiment of the present disclosure, a dielectric material 130 can be interposed between the signal electrodes 110 and the ground electrodes 120 such that the dielectric material can act as an insulator between adjacent electrodes. While signal electrodes 110 and ground electrodes 120 are illustrated as having a rectangular configuration, signal electrodes 110 can be configured to have any shape such that the shape contributes to the conductivity of an electrical signal applied to the signal electrodes 110 or ground electrodes 120 within the EMI filter 100. The capacitance formed between the signal and ground electrodes serves to shunt unwanted high frequency interference away from the signal electrodes.

Termination surfaces 140 can be coupled to the signal electrode arrays 115 when the signal electrodes 110 are flush with the top surface 105 and the bottom surface 106 (not shown) of the EMI filter housing 101. The termination surface 140 can include a plate or other structure to couple with connectors. Alternatively, connectors can be directly coupled to the termination surface. Likewise, termination surface 150 can be coupled with the ground electrodes 120 when they are flush with the side surface 107. While not explicitly illustrated, the bottom surface 106 of the EMI filter 100 can be substantially identical to the top surface 105. While termination surfaces 140 and 150 are illustrated, any type of termination or connection configurations can be used, for instance thin-film metallization and thick-film metallization well known in the industry.

In an embodiment of the present disclosure, the EMI filter 100 can be installed within the metal casing of an implanted medical device. For instance, the top surface 105 at termination surface 140 may be connected to electronic circuitry within the enclosed implanted filter such as a defibrillator or pacemaker. The bottom surface 106 of EMI filter 100 may be attached through termination surface 140 to a feed-through connector mounted in the enclosure of the implantable device and electrically coupled to lead wires that extend from the implanted device to regions of the body to provide medical therapy. The conductive leads can be implanted within an organ of a human body such as a heart. When the implantable medical device sends an electrical signal to the heart, the signal is conducted through the EMI filter using the signal electrodes 110 to the conductive leads implanted within the heart. For example, the implantable medical device can apply an electrical signal having a current of 65 A and a voltage of 800-1000V to the conductive leads. As the electrical signal passes through the EMI filter 100, a capacitance is generated between the signal electrodes 110, the ground electrodes 120, and the dielectric material 130 such that electromagnetic interference and noise can be prevented from affecting the electronic components of the implantable medical device. In addition, the implantable electronic component can also include a radio frequency (RF) device where the RF device wirelessly transmits and receives information from the medical device to a device external to the body in which the medical device is implanted. The RF device can also be coupled to EMI filter 100.

Figure 5:
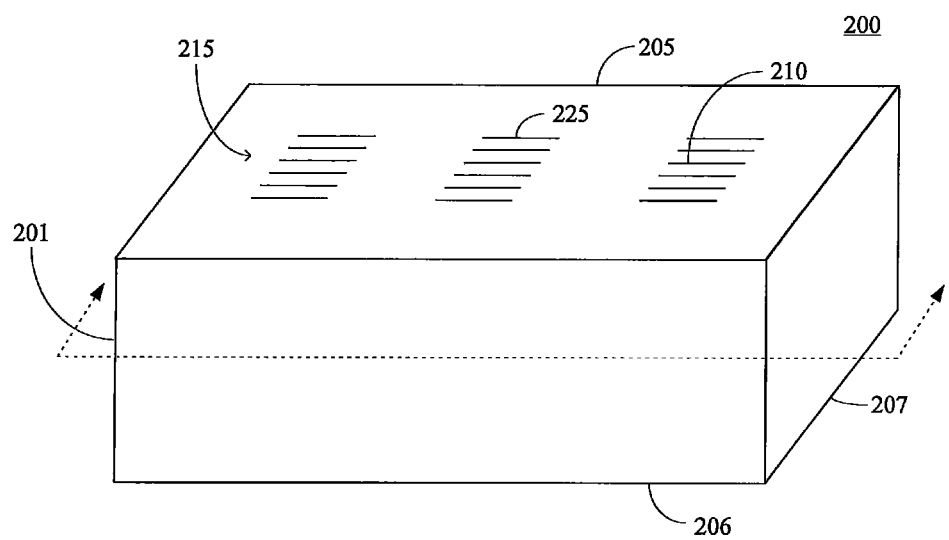
FIG. 5 provides an outer perspective view of an exemplary electromagnetic interference filter according to an exemplary embodiment of the present disclosure.
Figure 6:
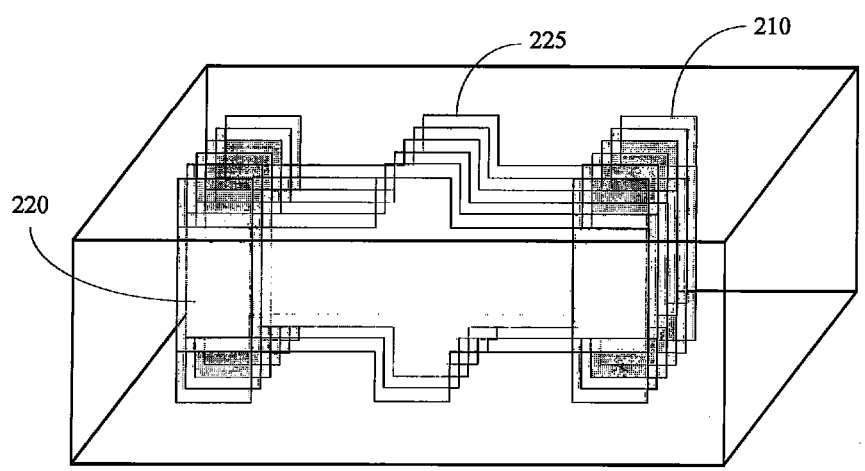
FIG. 6 provides an inner perspective view, in partial see-through, of an exemplary electromagnetic interference filter according to an exemplary embodiment of the present disclosure.
Figure 7:
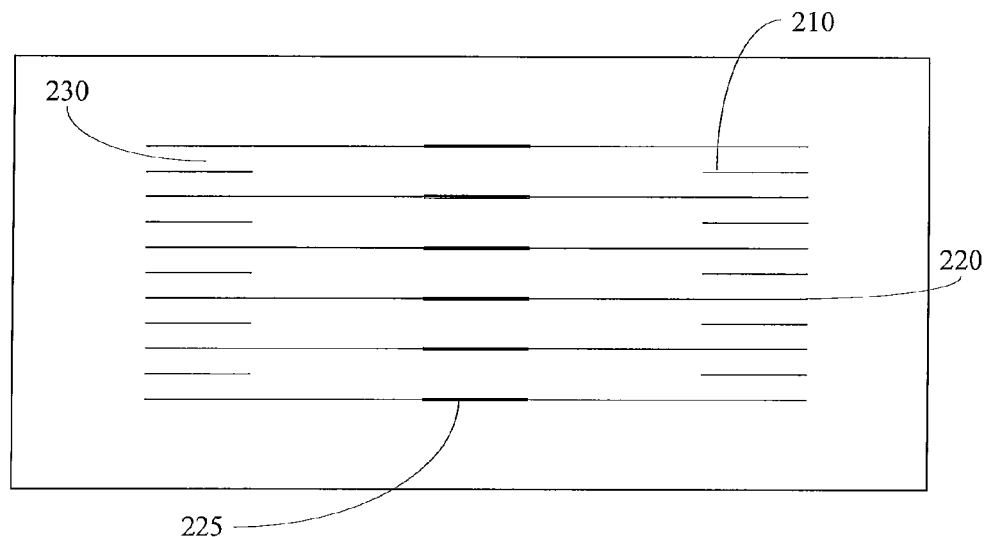
FIG. 7 provides a cross-sectional view of an exemplary electromagnetic interference filter according to an exemplary embodiment of the present disclosure.
Figure 8:
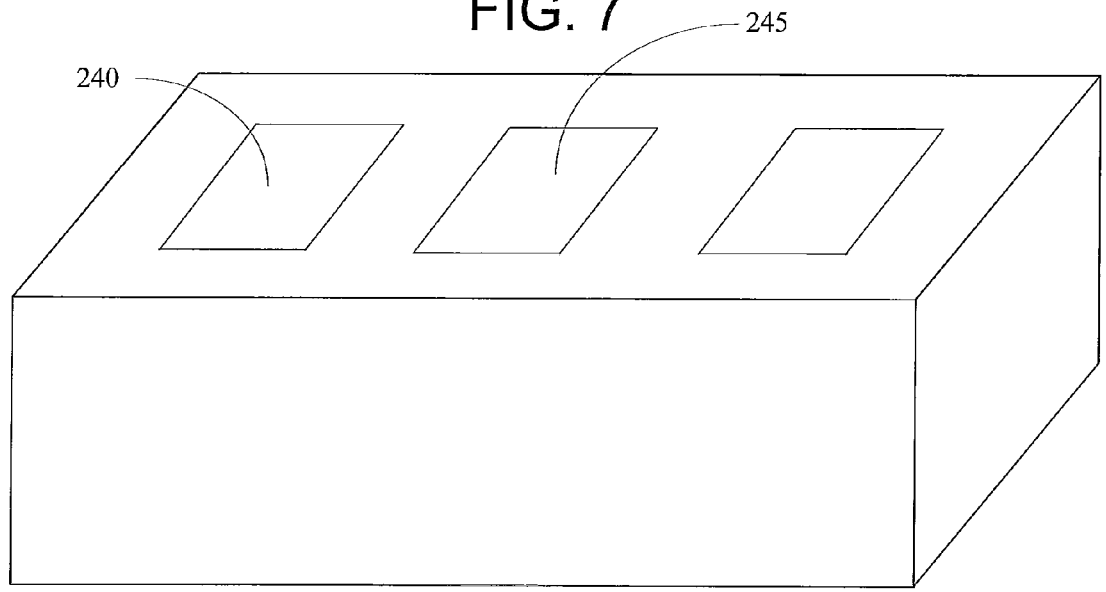
FIG. 8 provides an outer perspective view with exemplary terminations of an exemplary electromagnetic interference filter according to an exemplary embodiment of the present disclosure.

FIGS. 5-8 illustrate an exemplary electromagnetic interference filter according to another exemplary embodiment of the present disclosure. Specifically, FIG. 5 depicts an outer perspective view, FIG. 6 depicts an inner perspective view, FIG. 7 depicts a top view, and FIG. 8 depicts an outer perspective view with exemplary terminations.

Referring to FIGS. 5-8, an EMI filter generally 200 can be internally grounded. EMI filter 200 can include a plurality of signal electrodes 210 arranged in arrays 215. A plurality of signal electrodes 210 can be arranged in a vertical configuration such that each signal electrode 210 is flush with a top surface 205 and a bottom surface 206 of the EMI filter.

A plurality of ground or common electrodes 220 can be arranged in a parallel configuration. The ground electrodes 220 can be interposed with the signal electrodes 210. Each ground electrode 220 can be arranged in a vertical configuration such that each ground electrode 220 is flush with a top surface 205 and a bottom surface 206 of the EMI filter. Ground electrodes can include protrusions 225 that can be exposed on the top and/or bottom surfaces in regions distinct from signal electrodes.

As shown in FIG. 7, the signal electrodes 210 and ground electrodes 220 can be arranged in a parallel configuration such that the ground electrodes 220 are interposed between the signal electrodes 210. In an embodiment of the present disclosure, a dielectric material 230 can be interposed between the signal electrodes 210 and the ground electrodes 220 such that the dielectric material can act as an insulator between adjacent electrodes.

Termination surface 240 can be coupled to the signal electrode arrays 215 when the signal electrodes 210 are flush with the top surface 205 and the bottom surface 206 (not shown) of the EMI filter housing 201. Termination surface 245 can be coupled to the ground electrodes 220 when the protrusions 225 of the ground electrodes 220 are flush with the top surface 205 and the bottom surface 206 (not shown) of the EMI filter housing 201. While termination surfaces 240 and 245 are illustrated as plates, any type of termination or connection configurations can be implemented.

Figure 9:
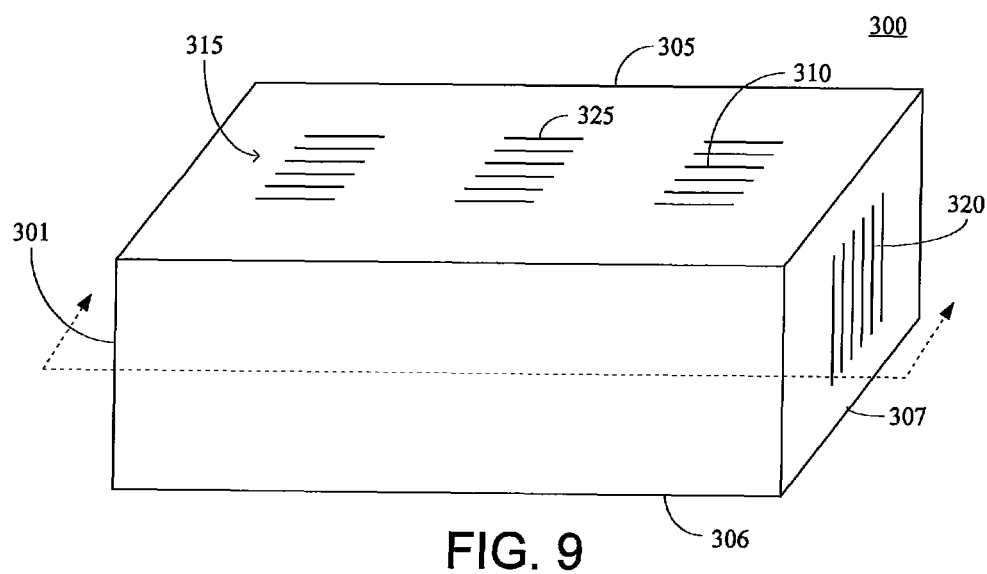
FIG. 9 provides an outer perspective view of an exemplary electromagnetic interference filter according to an exemplary embodiment of the present disclosure.
Figure 10:
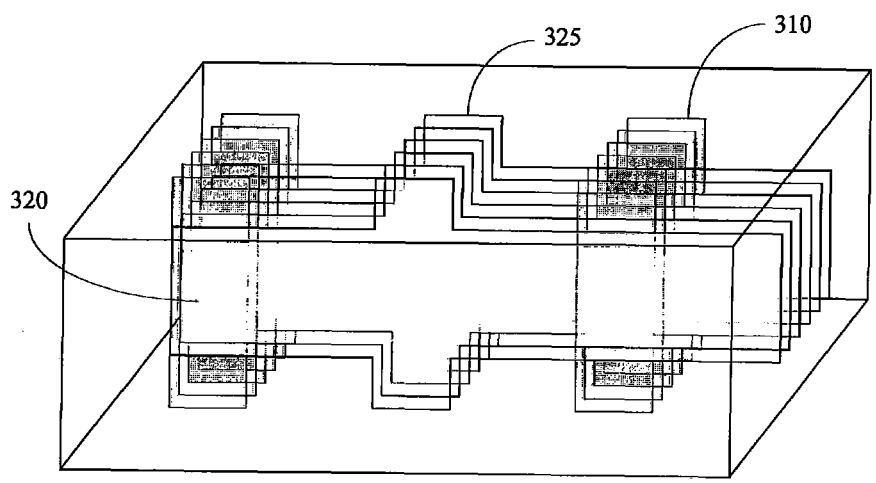
FIG. 10 provides an inner perspective view, in partial see-through, of an exemplary electromagnetic interference filter according to an exemplary embodiment of the present disclosure.
Figure 11:
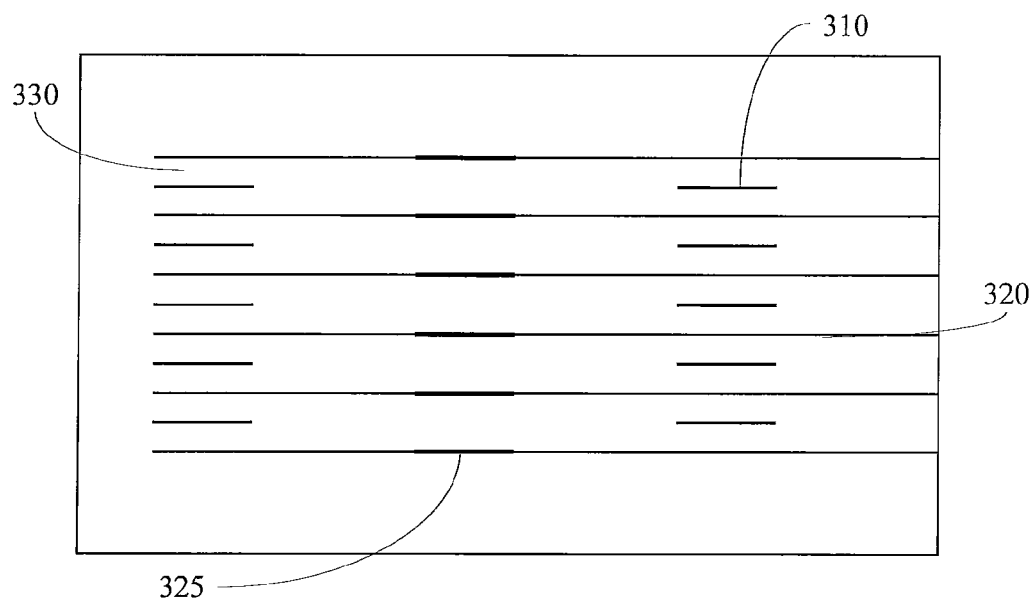
FIG. 11 provides a cross-sectional view of an exemplary electromagnetic interference filter according to an exemplary embodiment of the present disclosure.
Figure 12:
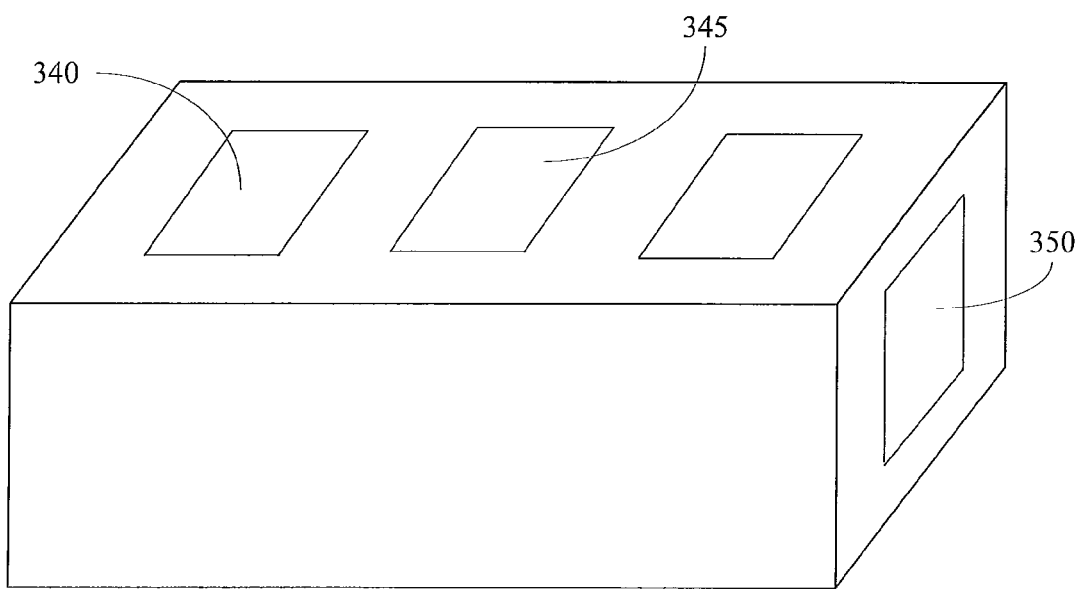
FIG. 12 provides an outer perspective view with exemplary terminations of an exemplary electromagnetic interference filter according to an exemplary embodiment of the present disclosure.

FIGS. 9-12 illustrate an exemplary electromagnetic interference filter according to another exemplary embodiment of the present disclosure. Specifically, FIG. 9 depicts an outer perspective view, FIG. 10 depicts an inner perspective view, FIG. 11 depicts a top view, and FIG. 12 depicts an outer perspective view with exemplary terminations.

Referring to FIGS. 9-12, an EMI filter generally 300 can be both internally grounded and externally grounded. EMI filter 300 can include a plurality of signal electrodes 310 arranged in arrays 315. A plurality of signal electrodes 310 can be arranged in a vertical configuration such that each signal electrode 310 is flush with a top surface 305 and a bottom surface 306 of the EMI filter.

A plurality of ground or common electrodes 320 can be arranged in a parallel configuration. The ground electrodes 320 can be interposed with the signal electrodes 310. Each ground electrode 320 can be arranged in a vertical configuration such that a protrusion 325 of each ground electrode 320 is flush with a top surface 305 and a bottom surface 306 of the EMI filter 300. In addition, one end of the ground electrodes 320 can be flush with a side surface 307 such that the EMI filter 300 can be grounded externally.

As shown in FIG. 11, the signal electrodes 310 can be arranged in a parallel configuration. Likewise, the ground electrodes 320 can also be arranged in a parallel configuration where portions 325 are exposed on top and/or bottom surfaces and one end of the ground electrodes 320 extends to be flush with at least one side surface 307. In one embodiment of the present disclosure, a dielectric material 330 can be interposed between the signal electrodes 310 and the ground electrodes 320 such that the dielectric material can act as an insulator between adjacent electrodes.

Termination surface 340 can be coupled to the signal electrode arrays 315 when the signal electrodes 310 are flush with the top surface 305 and the bottom surface 306 (not shown) of the EMI filter housing 301. Termination surface 345 can be coupled to protrusions 325 of the ground electrodes 320 when the protrusions 325 of the ground electrodes 320 are flush with the top surface 305 and/or the bottom surface 306 (not shown) of the EMI filter housing 301. Likewise, termination surface 350 can be coupled with the ground electrodes 320 when they extend to be flush with the side surface 307. While termination surfaces 340, 345 and 350 are illustrated as plates, any type of termination or connection configurations can be used.

Figure 13:
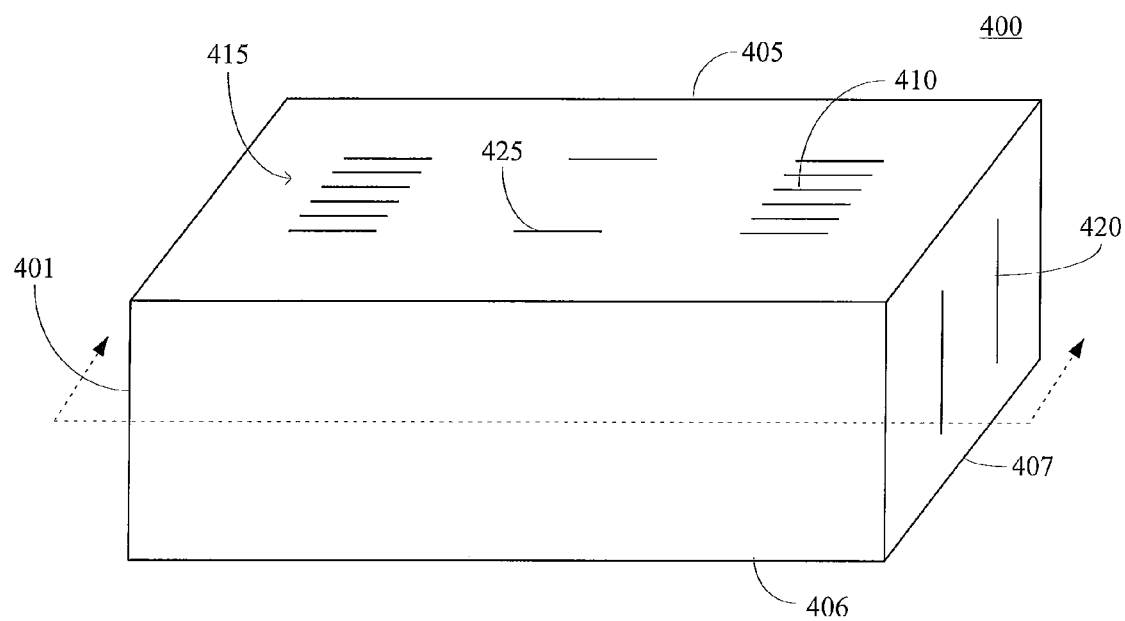
FIG. 13 provides an outer perspective view of an exemplary electromagnetic interference filter according to an exemplary embodiment of the present disclosure.
Figure 14:
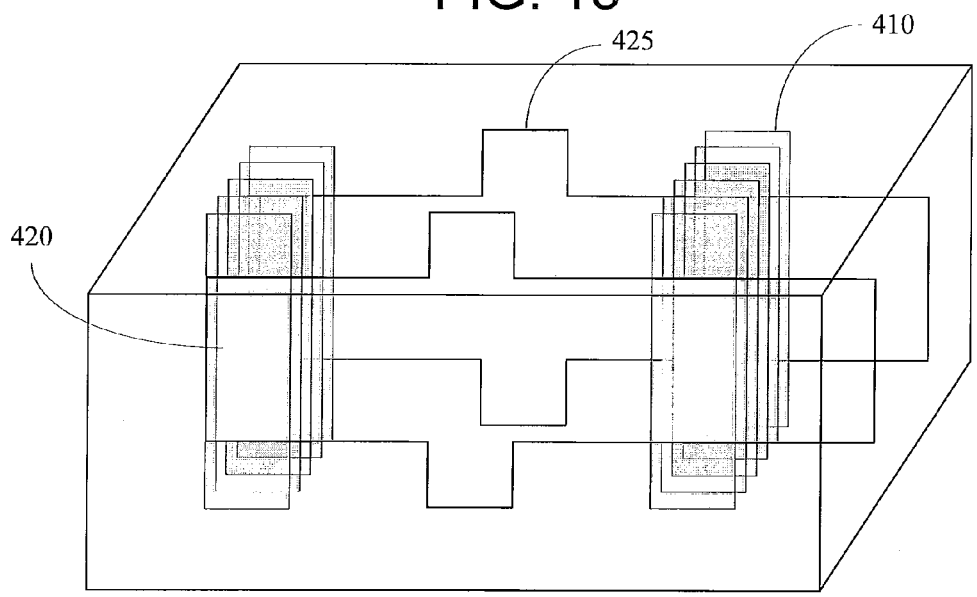
FIG. 14 provides an inner perspective view, in partial see-through, of an exemplary electromagnetic interference filter according to an exemplary embodiment of the present disclosure.
Figure 15:
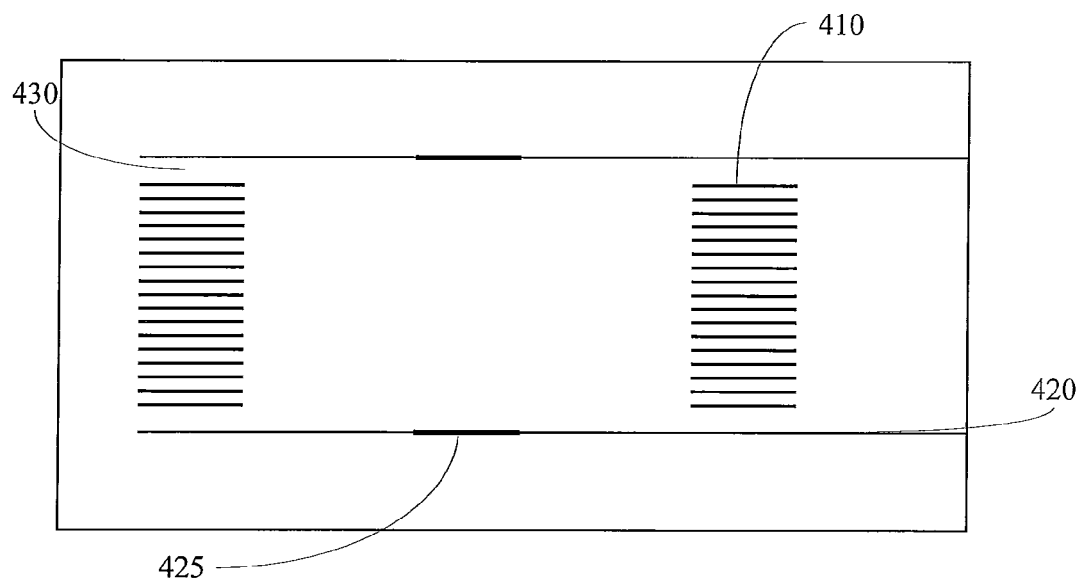
FIG. 15 provides a cross-sectional view of an exemplary electromagnetic interference filter according to an exemplary embodiment of the present disclosure.
Figure 16:
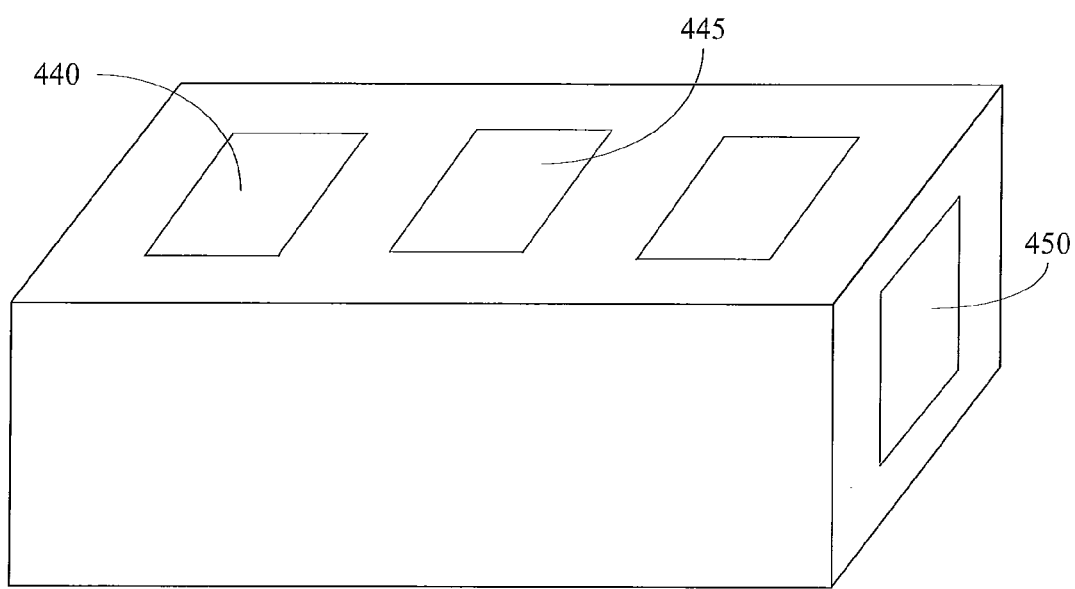
FIG. 16 provides an outer perspective view with exemplary terminations of an exemplary electromagnetic interference filter according to an exemplary embodiment of the present disclosure.

FIGS. 13-16 illustrate an exemplary electromagnetic interference filter according to another exemplary embodiment of the present disclosure. Specifically, FIG. 13 depicts an outer perspective view, FIG. 14 depicts an inner perspective view, FIG. 15 depicts a top view, and FIG. 16 depicts an outer perspective view with exemplary terminations.

Referring to FIGS. 13-16, an EMI filter generally 400 can be both internally grounded and externally grounded. EMI filter 400 can include a plurality of signal electrodes 410 arranged in arrays 415. A plurality of signal electrodes 410 can be arranged in a vertical configuration such that each signal electrode 410 is flush with a top surface 405 and a bottom surface 406 of the EMI filter.

Ground or common electrodes 420 can be arranged in a parallel configuration. The ground electrodes 420 can be disposed to couple to the outermost of the plurality of signal electrodes 310. Each ground electrode 420 can be arranged in a vertical configuration such that each ground electrode 420 is flush with a top surface 405 and a bottom surface 406 of the EMI filter 400. In addition, at least one end of the ground electrodes 420 can extend to be flush with at least a side surface 407 such that the EMI filter 400 can be grounded externally.

As shown in FIG. 15, the signal electrodes 410 can be arranged in a parallel configuration. Likewise, the ground electrodes 420 can also be arranged in a parallel configuration disposed outside of the plurality of signal electrodes 410 and where portions 425 are exposed on top and/or bottom surfaces. At least one end of the ground electrodes 420 can extend to be flush with at least one side surface 407. In an embodiment of the present disclosure, a dielectric material 430 can be interposed between the signal electrodes 410 and between the signal electrodes 410 and the ground electrodes 420 such that the dielectric material can act as an insulator between adjacent electrodes.

Termination surface 440 can be coupled to the signal electrode arrays 415 when the signal electrodes 410 are flush with the top surface 405 and the bottom surface 406 (not shown) of the EMI filter housing 401. Termination surface 445 can be coupled to the protrusions 425 of the ground electrodes 420 when the protrusions 425 of the ground electrodes 420 are flush with the top surface 405 and the bottom surface 406 (not shown) of the EMI filter housing 401. Likewise, termination surface 450 can be coupled with the ground electrodes 420 when they extend to be flush with the side surface 407. While termination surfaces 440 and 450 are illustrated as plates, any type of termination or connection configurations can be used.

Figure 17:
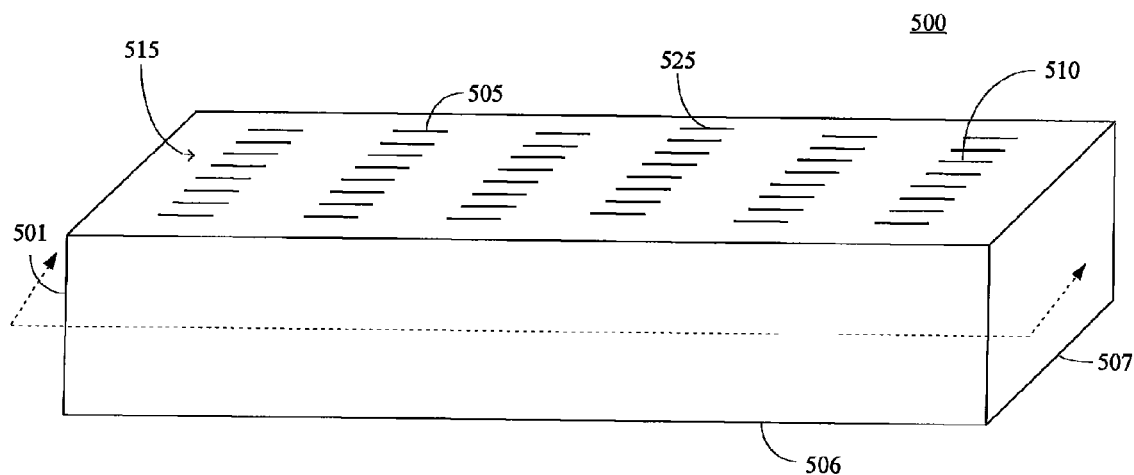
FIG. 17 provides an outer perspective view of an exemplary electromagnetic interference filter according to an exemplary embodiment of the present disclosure.
Figure 18:
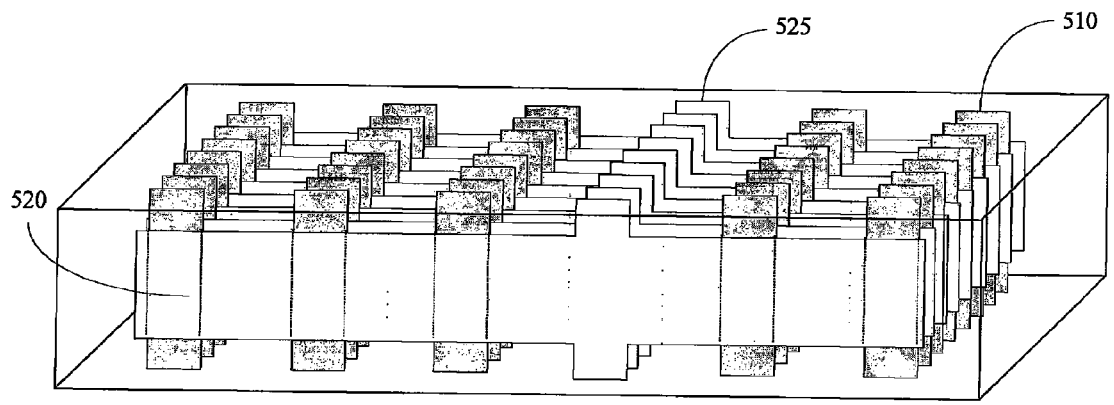
FIG. 18 provides an inner perspective view, in partial see-through, of an exemplary electromagnetic interference filter according to an exemplary embodiment of the present disclosure.
Figure 19:
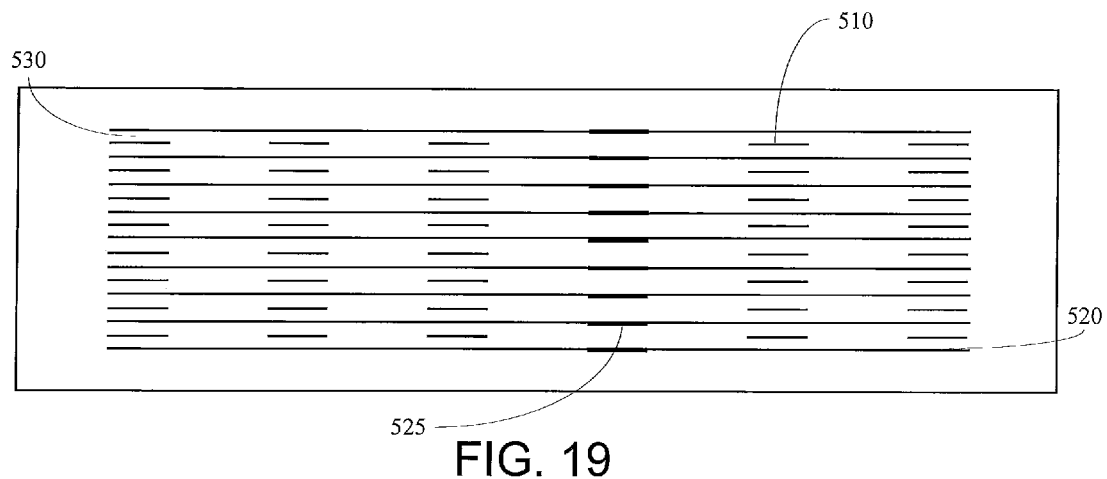
FIG. 19 provides a cross-sectional view of an exemplary electromagnetic interference filter according to an exemplary embodiment of the present disclosure.
Figure 20:
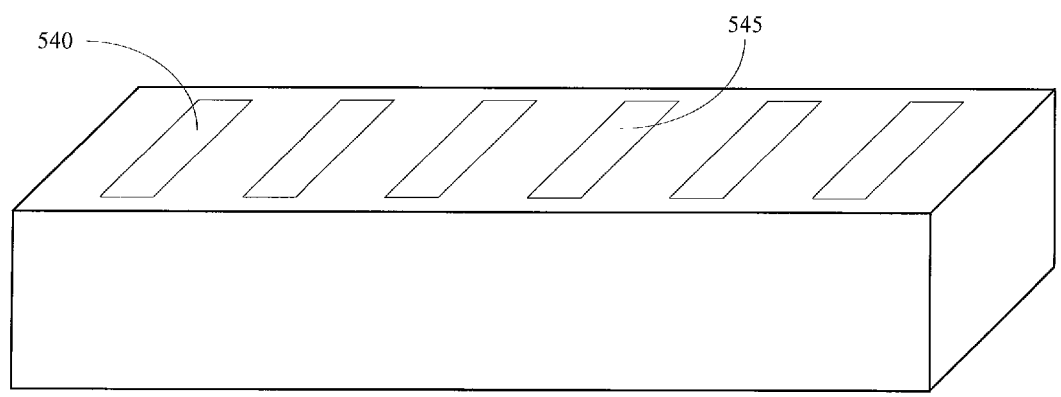
FIG. 20 provides an outer perspective view with exemplary terminations of an exemplary electromagnetic interference filter according to an exemplary embodiment of the present disclosure.
Figure 21:
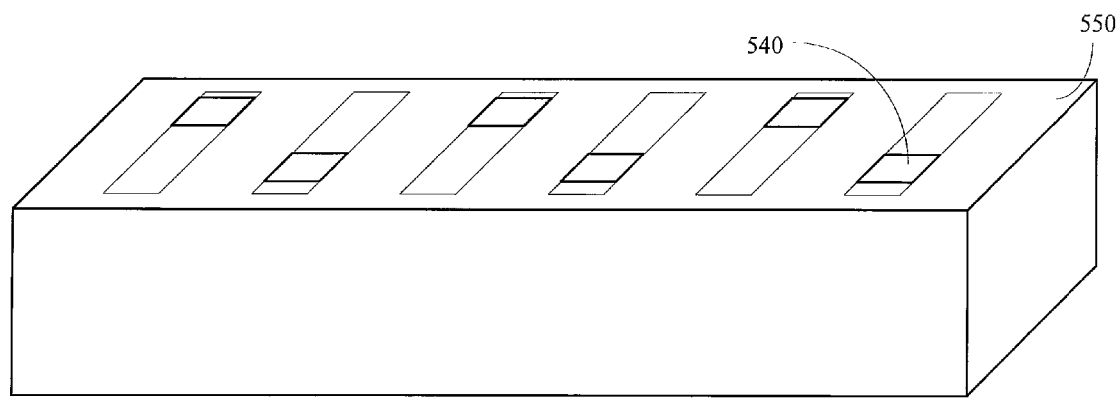
FIG. 21 provides an outer perspective view of an exemplary electromagnetic interference filter according to an exemplary embodiment of the present disclosure.
Figure 22:
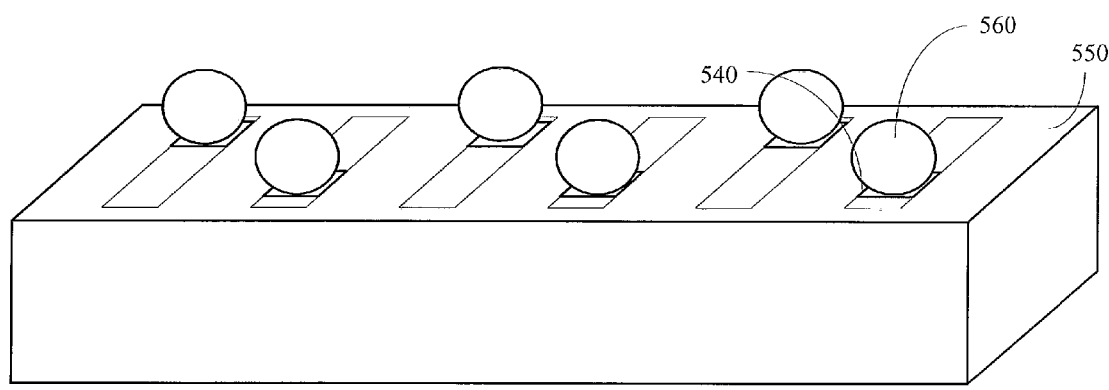
FIG. 22 provides an outer perspective view of an exemplary electromagnetic interference filter according to an exemplary embodiment of the present disclosure.

FIGS. 17-22 illustrate an exemplary electromagnetic interference filter according to another exemplary embodiment of the present disclosure. Specifically, FIG. 17 depicts an outer perspective view, FIG. 18 depicts an inner perspective view, FIG. 19 depicts a cross-sectional view, FIG. 20 depicts an outer perspective view with external terminations, FIG. 21 depicts an outer perspective view with a passivation layer, and FIG. 22 depicts an outer perspective view with a passivation layer and alternative external terminations.

Referring to FIGS. 17-20, an EMI filter generally 500 can be provided for filtering or shielding undesirable electromagnetic interference from an electronic device such as an implantable medical device. EMI filter 500 can include a plurality of signal electrodes 510 arranged in a plurality of arrays 515. The plurality of signal electrodes 510 can be arranged in a vertical configuration such that each signal electrode 510 is flush with a top surface 505 and a bottom surface 506 of the EMI filter 500.

Ground electrodes 520 can be disposed in a parallel configuration and interposed between the signal electrodes 510. The ground electrodes 520 can include protrusions 525 that can be flush with the top surface 505 and/or the bottom surface 506 of the filter 500. A dielectric material 530 can be interposed between the signal electrodes 510 and the ground electrodes 520 such that the dielectric material can act as an insulator between adjacent electrodes.

Termination surfaces 540 can be coupled to the signal electrode arrays 515 when the signal electrodes 510 are flush with the top surface 505 and/or the bottom surface 506 of the filter housing 501. Termination surface 545 can be coupled to protrusions 525 of the ground electrodes 520 when the protrusions 525 are flush with the top surface 505 and/or the bottom surface 506 of the filter housing 501. While termination surfaces 540 and 545 are illustrated as plates, any type of termination or connection configurations can be implemented.

As illustrated in FIG. 21, a passivation layer 550 can be provided on the filter housing 501. The passivation layer 550 can be formed in any manner such as depositing passivation material onto the housing 501 or exposing housing material to a method to produce a passivation layer 550. A portion of the termination surface 540 can be exposed through the passivation layer 550. While the passivation layer 550 is only illustrated on the top surface 505 of the filter housing 501, the passivation layer 550 can be provided on any surface of the housing 501. Further, as illustrated in FIG. 22, a solder ball connection 560 can be coupled with termination surface 540 through the passivation layer 550 to couple a conductive element, such as a connection to internal/external circuitry of the implanted device, with the filter 500.

Figure 23:
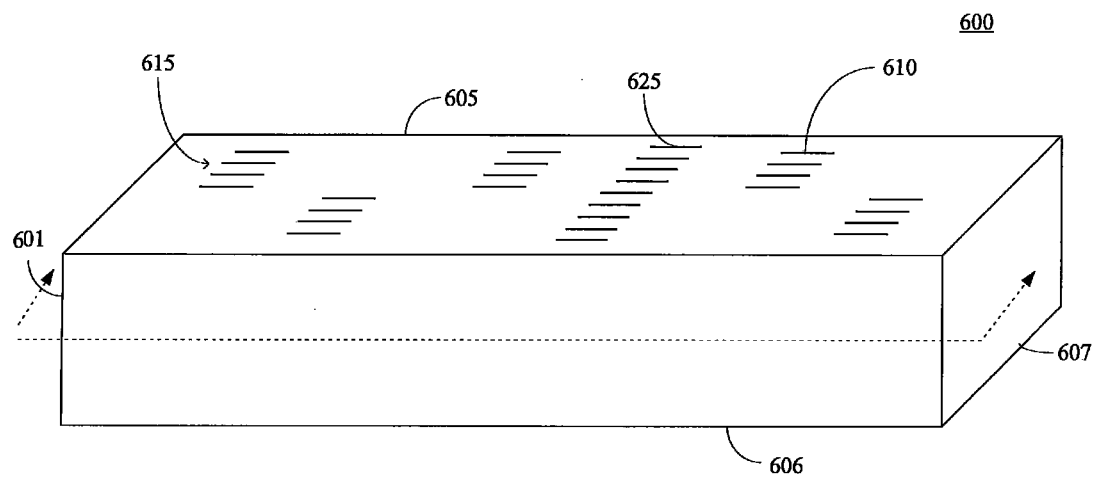
FIG. 23 provides an outer perspective view of an exemplary electromagnetic interference filter according to an exemplary embodiment of the present disclosure.
Figure 24:
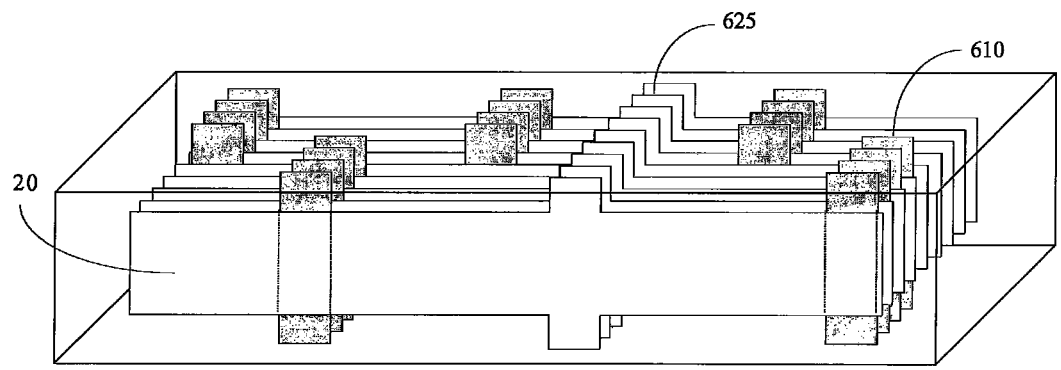
FIG. 24 provides an inner perspective view, in partial see-through, of an exemplary electromagnetic interference filter according to an exemplary embodiment of the present disclosure.
Figure 25:
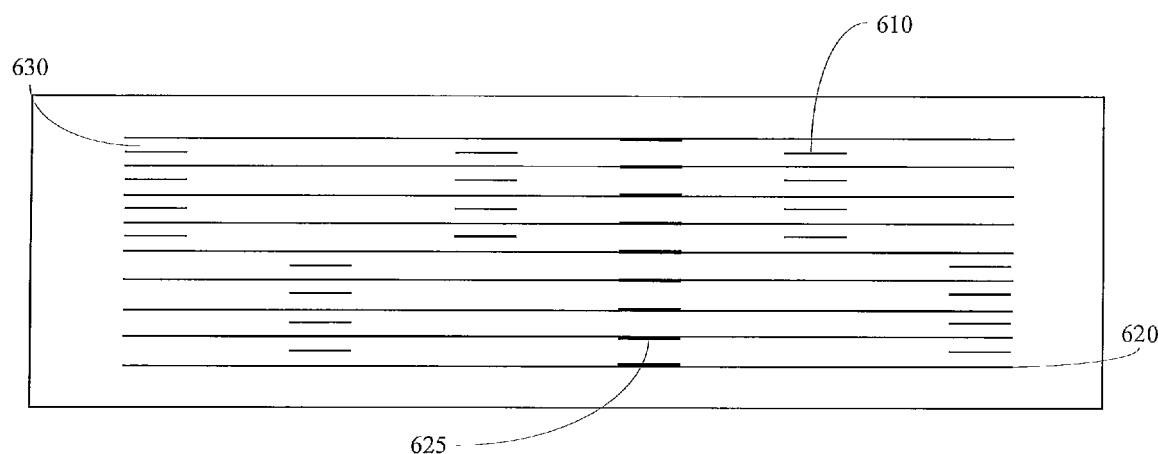
FIG. 25 provides a cross-sectional view of an exemplary electromagnetic interference filter according to an exemplary embodiment of the present disclosure.
Figure 26:
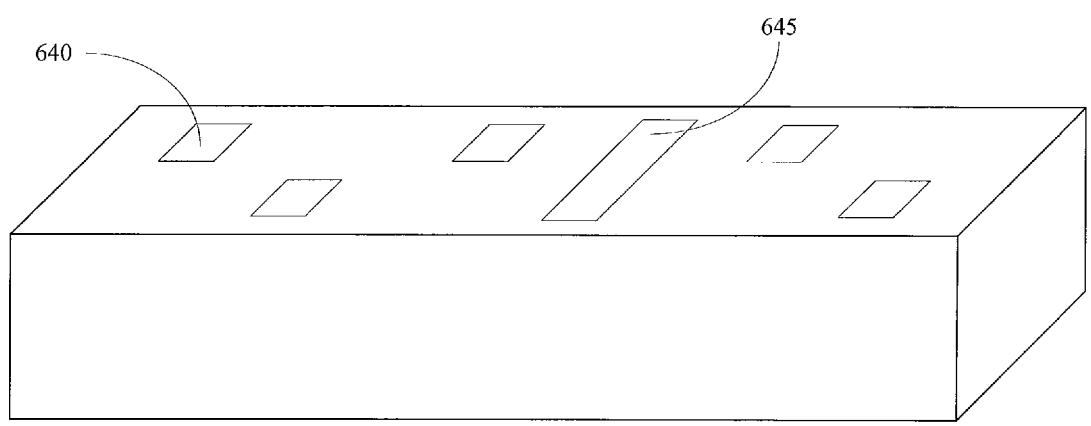
FIG. 26 provides an outer perspective view with exemplary terminations of an exemplary electromagnetic interference filter according to an exemplary embodiment of the present disclosure.

FIGS. 23-26 illustrate an exemplary electromagnetic interference filter according to another exemplary embodiment of the present disclosure. Specifically, FIG. 23 depicts an outer perspective view, FIG. 24 depicts an inner perspective view, FIG. 25 depicts a cross-sectional view, and FIG. 26 depicts an outer perspective view with external terminations.

Referring to FIGS. 23-26, an EMI filter generally 600 can be provided for filtering or shielding undesirable electromagnetic interference from an electronic device such as an implantable medical device. EMI filter 600 can include a plurality of signal electrodes 610 arranged in a plurality of arrays 615. The plurality of arrays 615 can be less than the width of the filter 600 and have an alternating arrangement. The plurality of signal electrodes 610 can be arranged in a vertical configuration such that each signal electrode 610 is flush with a top surface 605 and a bottom surface 606 of the filter housing 601.

Ground electrodes 620 can be disposed in a parallel configuration and interposed between each of the signal electrodes 610. The ground electrodes 620 can include protrusions 625 that can be flush with the top surface 605 and/or the bottom surface 606 of the filter 600. A dielectric material 630 can be interposed between the signal electrodes 610 and the ground electrodes 620 such that the dielectric material can act as an insulator between adjacent electrodes.

Termination surfaces 640 can be coupled to the signal electrode arrays 615 when the signal electrodes 610 are flush with the top surface 605 and/or the bottom surface 606 of the filter housing 601. The termination surface 640 can correspond to each array 615 such that the termination surface 640 is applied only to the portion of the top surface 605 and/or the bottom surface 606 in associated with the signal electrodes 610. Termination surface 645 can be coupled to protrusions 625 of the ground electrodes 620 when the protrusions 625 are flush with the top surface 605 and/or the bottom surface 606 of the filter housing 601. The termination surface 645 can be coupled between some or all the protrusions 625 of the ground electrodes 620. While termination surfaces 640 and 645 are illustrated as plates, any type of termination or connection configurations can be implemented.

Figure 27:
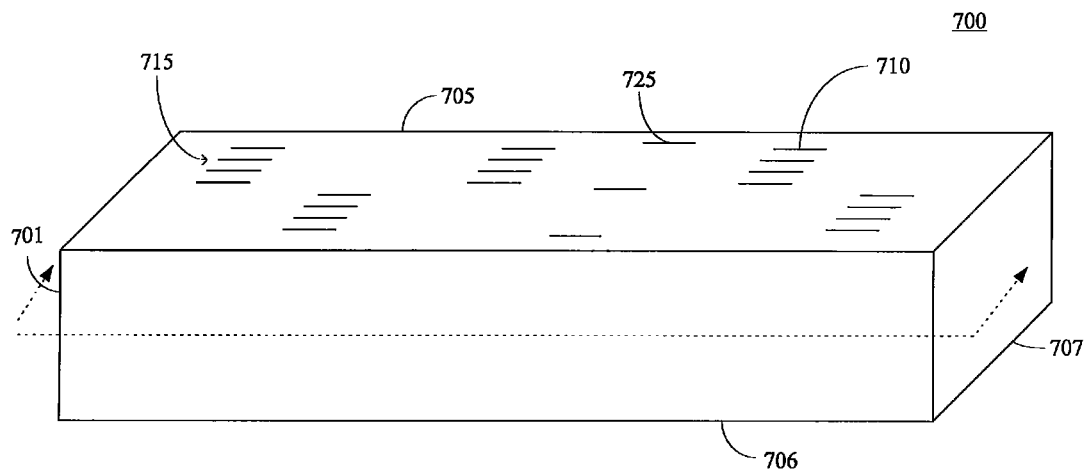
FIG. 27 provides an outer perspective view of an exemplary electromagnetic interference filter according to an exemplary embodiment of the present disclosure.
Figure 28:
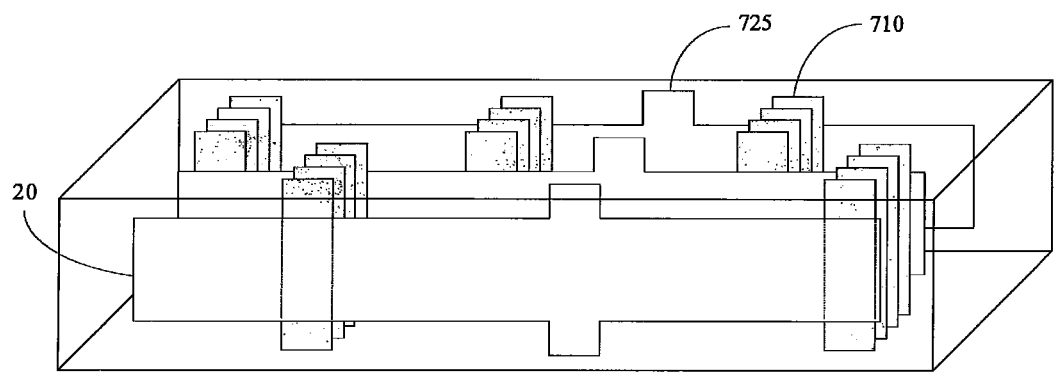
FIG. 28 provides an inner perspective view, in partial see-through, of an exemplary electromagnetic interference filter according to an exemplary embodiment of the present disclosure.
Figure 29:
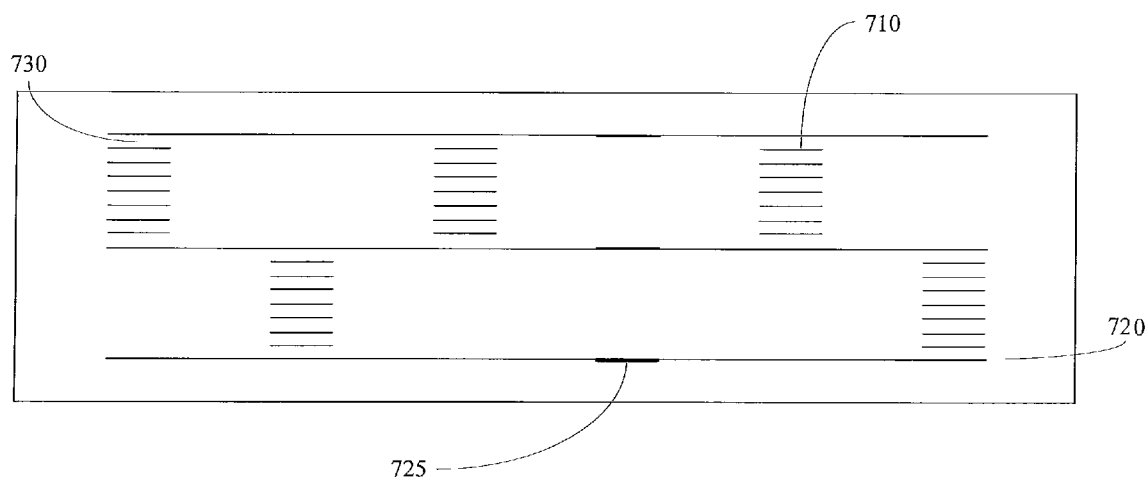
FIG. 29 provides a cross-sectional view of an exemplary electromagnetic interference filter according to an exemplary embodiment of the present disclosure.
Figure 30:
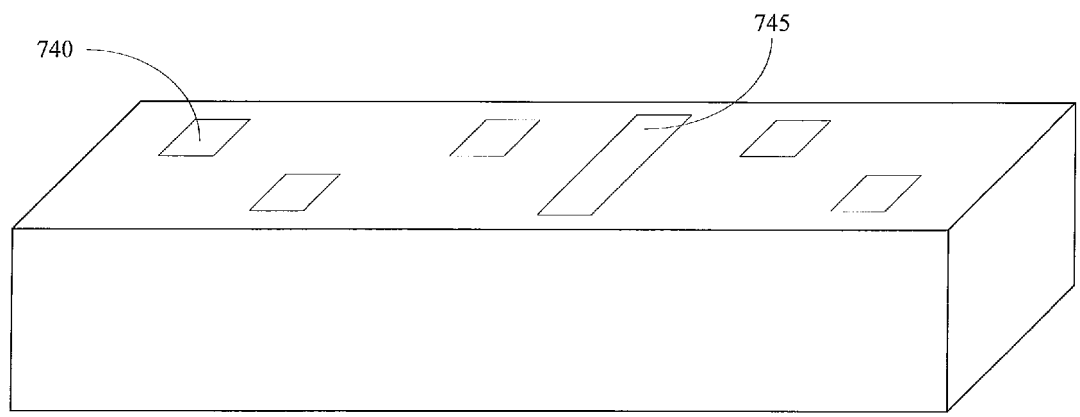
FIG. 30 provides an outer perspective view with exemplary terminations of an exemplary electromagnetic interference filter according to an exemplary embodiment of the present disclosure.

FIGS. 27-30 illustrate an exemplary electromagnetic interference filter according to another exemplary embodiment of the present disclosure. Specifically, FIG. 27 depicts an outer perspective view, FIG. 28 depicts an inner perspective view, FIG. 29 depicts a cross-sectional view, and FIG. 30 depicts an outer perspective view with external terminations.

Referring to FIGS. 27-30, an EMI filter generally 700 can be provided for filtering or shielding undesirable electromagnetic interference from an electronic device such as an implantable medical device. EMI filter 700 can include a plurality of signal electrodes 710 arranged in a plurality of arrays 715. The plurality of arrays 715 can have any arrangement and/or configuration such as having surface area less than the width of the filter 700 and having an alternating array arrangement. The plurality of signal electrodes 710 can be arranged in a vertical configuration such that each signal electrode 710 is flush with a top surface 705 and a bottom surface 706 of the filter housing 701.

Ground electrodes 720 can be disposed in a parallel configuration and interposed between each of the electrodes arrays 715. The ground electrodes 720 can include protrusions 725 that can be flush with the top surface 705 and/or the bottom surface 706 of the filter 700. A dielectric material 730 can be interposed between the signal electrodes 710 and the ground electrodes 720 such that the dielectric material can act as an insulator between adjacent electrodes.

Termination surfaces 740 can be coupled to the signal electrode arrays 715 when the signal electrodes 710 are flush with the top surface 705 and/or the bottom surface 706 of the filter housing 701. The termination surface 740 can correspond to each array 715 such that the termination surface 740 is applied only to the portion of the top surface 705 and/or the bottom surface 706 in associated with the signal electrodes 710. Termination surface 745 can be coupled between all protrusions 725 of the ground electrodes 720 when the protrusions 725 are flush with the top surface 705 and/or the bottom surface 706 of the filter housing 701. While termination surfaces 740 and 745 are illustrated as plates, any type of termination or connection configurations can be implemented.

Figure 31:
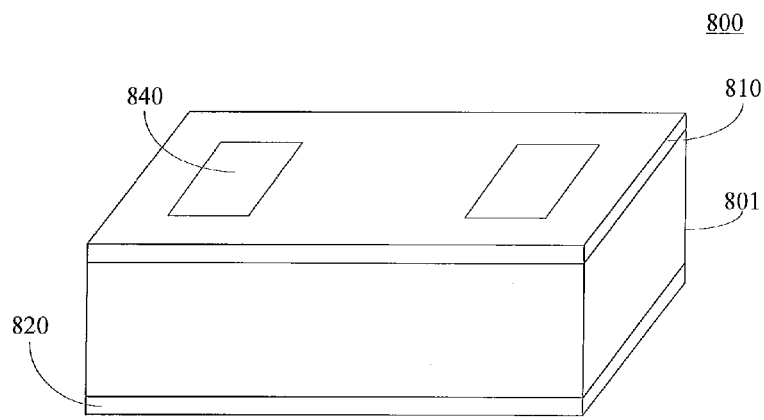
FIG. 31 provides an outer perspective view of an exemplary electromagnetic interference filter according to an exemplary embodiment of the present disclosure.

FIG. 31 illustrates an exemplary electromagnetic interference filter generally 800 according to another exemplary embodiment of the present disclosure. EMI filter 800 can have a passivation layer 810, 820 in a top surface and/or a bottom surface of the filter housing 801. The passivation layers 810, 820 can prevent arcing between termination arrays 840.

Figures 32, 33:
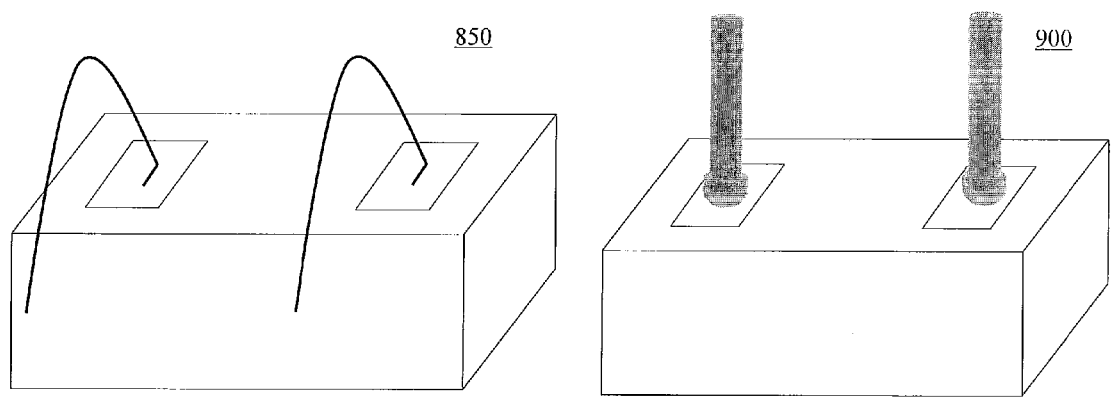
FIG. 32 provides an outer perspective view of an exemplary electromagnetic interference filter according to an exemplary embodiment of the present disclosure.
FIG. 33 provides an outer perspective view of an exemplary electromagnetic interference filter according to an exemplary embodiment of the present disclosure.
Figure 34:
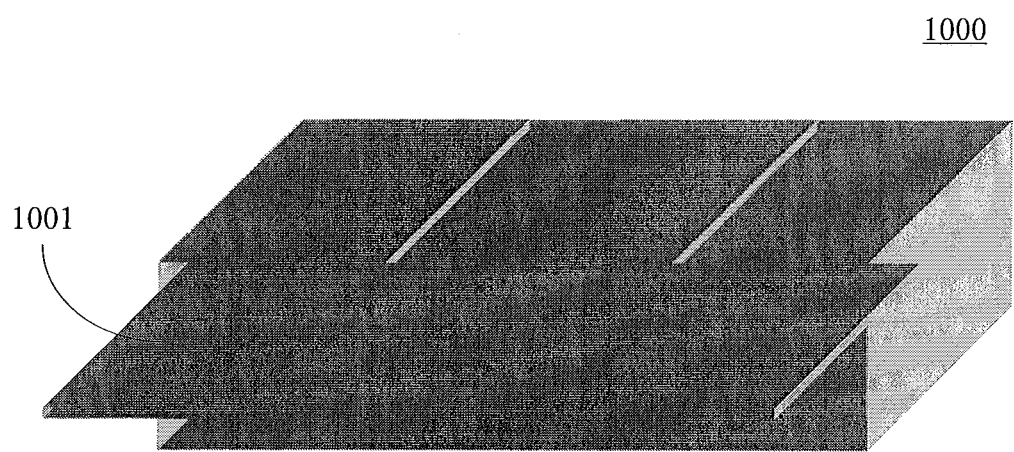
FIG. 34 provides an outer perspective view of an exemplary electromagnetic interference filter according to an exemplary embodiment of the present disclosure.
Figure 35:
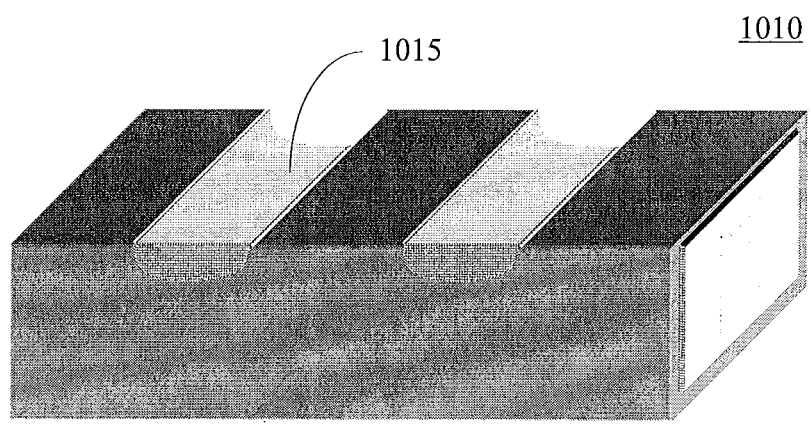
FIG. 35 provides an outer perspective view of an exemplary electromagnetic interference filter according to an exemplary embodiment of the present disclosure.

FIGS. 32-35 illustrate exemplary electromagnetic interference filter coupling techniques according to exemplary embodiments of the present disclosure. As illustrated in FIG. 32, the EMI filter generally 850 can be electrically coupled using a bonding technique as will be well understood by those of ordinary skill in the art. For instance, a gold wire bond technique can be used. As illustrated in FIG. 33, the EMI filter generally 900 can be electrically coupled using a ball-grid array coupling technique as will be well understood by those of ordinary skill in the art. As illustrated in FIG. 34, the EMI filter generally 1000 can be electrically coupled using a soldering technique as will be well understood by those of ordinary skill in the art. For instance, a flex-circuit 1001 can be electrically coupled to the EMI filter 1000 using a solder connection. As illustrated in FIG. 35, the EMI filter generally 1010 can be electrically coupled using a castellation technique as will be well understood by those of ordinary skill in the art. For instance, a trench 1015 can be formed in the top surface and/or the bottom surface of the EMI filter 1010 such that the trenches intersect signal electrode arrays and/or grounding sink arrays. The present written description uses examples to disclose the presently disclosed subject matter, including the best mode, and also to enable any person skilled in the art to practice the presently disclosed subject matter, including making and using any devices or systems and performing any incorporated methods.

While the presently disclosed subject matter has been described in detail with respect to specific embodiments thereof, it will be appreciated that those skilled in the art, upon attaining an understanding of the foregoing may readily adapt the present technology for alterations or additions to, variations of, and/or equivalents to such embodiments. Accordingly, the scope of the present disclosure is by way of example rather than by way of limitation, and the subject disclosure does not preclude inclusion of such modifications, variations, and/or additions to the presently disclosed subject matter as would be readily apparent to one of ordinary skill in the art.

What is claimed is:

1. An electromagnetic interference (EMI) filter, comprising:
    a plurality of signal electrodes arranged in a respective plurality of arrays, with each signal electrode extending vertically between respective top and bottom surfaces of the filter such that the signal electrodes are flush with such top and bottom surfaces, and configured to be coupled on said top surface of the filter to internal conductors of an implantable medical device and coupled on said bottom surface of the filter to external lead wires implanted within a body in which such medical device is implanted;
    a plurality of ground electrodes arranged in parallel and interposed between the signal electrodes, such ground electrodes grounded at least one of internally and externally;
    dielectric material disposed between the signal electrodes and ground electrodes to act as insulator material between adjacent electrodes, and to define a filter body having a length along a longitudinal axis thereof, a thickness between the top and bottom surfaces thereof, and a width in the axis perpendicular to such longitudinal axis and the thickness; and
    metallization applied to selected regions on the top and bottom surfaces of the filter to connect respective arrays of signal electrodes and provide an interconnection surface for electrically attaching the filter to other components;
    wherein said signal electrodes each have a length dimension along the longitudinal axis of the filter which is less than one-half of the length of the filter along the longitudinal axis thereof, and said ground electrodes each have a length dimension along the longitudinal axis of the filter which is more than one-half of the length of the filter along the longitudinal axis thereof, and wherein the filter acts as a shielding element to prevent unwanted electromagnetic interference with the input and output of an associated implanted medical device.

2. An electromagnetic interference filter as in claim 1, further including:
    a passivation layer on at least one of a top and bottom surface of the electromagnetic interference filter to prevent arcing between the plurality of signal electrode arrays.

3. An electromagnetic interference filter as claim 1, further including ground terminators applied to selected regions on at least one of the top, bottom and side surfaces of the EMI filter so as to connect pluralities of ground electrodes and provide an interconnection surface for electrically attaching ground to such filter.

4. An electromagnetic interference filter as in claim 3, wherein the ground electrodes are grounded internally by being exposed and connected at least one location on the top and bottom surfaces of the filter.

5. An electromagnetic interference filter as in claim 3, wherein the ground electrodes are grounded externally by being exposed and connected at a location on a side surface of the filter.

6. An electromagnetic interference filter as in claim 3, wherein the ground electrodes are grounded both internally and externally.

7. An electromagnetic interference filter as in claim 1, wherein the filter is substantially monolithic.

8. An electromagnetic interference filter as in claim 1, wherein:
    each array includes a plurality of such signal electrodes arranged in parallel in a relatively densely packed configuration such that current conductivity capability is between such filter top surface and such filter bottom surface.

9. An electromagnetic interference filter as in claim 1, wherein the signal electrodes have a preselected configuration and arrangement relative to the ground electrodes so as provide selected conductivity of an electrical signal applied to the signal electrodes or ground electrodes, and to form selected capacitance between the signal and ground electrodes, for shunting unwanted high frequency interference away from the signal electrodes.

10. An electromagnetic interference filter as in claim 1, wherein the metallization comprises termination surfaces coupled to the signal electrode arrays.

11. An electromagnetic interference filter as in claim 10, wherein the ground termination surfaces comprise one of a plate and connector couplers.

12. An electromagnetic interference filter as in claim 3, wherein the ground terminations comprise one of thin-film metallization and thick-film metallization.

13. An electromagnetic interference filter as in claim 1, wherein:
   each ground electrode is arranged in a vertical configuration such that each ground electrode is flush with a top surface and a bottom surface of the filter, and wherein each ground electrode further includes protrusions that are exposed on at least one of the top and bottom surfaces in regions distinct from the signal electrodes; and
   the filter further includes a termination surface coupled to the ground electrode protrusions so that the ground electrodes are grounded internally.

14. An electromagnetic interference filter as in claim 13, wherein one end of the ground electrodes is flush with a side surface of the filter, and another termination surface is coupled to the ground electrodes at such side surface so that the ground electrodes are also grounded externally.

15. An electromagnetic interference filter as in claim 2, further including:
   a solder ball connection coupled through the passivation layer to couple a conductive element with the filter.

16. An electromagnetic interference filter as in claim 1, wherein said plurality of arrays of signal electrodes each have a surface area less than the width of the filter and having an alternating arrangement.

17. An electromagnetic interference filter as in claim 1, wherein:
   said metallization provides an interconnection surface for electrically attaching the filter to other components; and
   wherein such interconnection surface includes connection made thereto including at least one of a wire bonding, a ball-grid array coupling, a solder connection, and a castellation coupling.

18. Methodology for use of an electromagnetic interference (EMI) filter with an implantable medical device, comprising the steps of:
   providing a plurality of signal electrodes for an EMI filter, arranged in a respective plurality of arrays, with each signal electrode extending vertically between respective top and bottom surfaces of the filter such that the signal electrodes are flush with such top and bottom surfaces, and configured to be coupled on the top surface of the filter to internal conductors of an implantable medical device and coupled on the bottom surface of the filter to external lead wires implanted within a body in which such medical device is implanted;
   providing a plurality of ground electrodes arranged in parallel and interposed between the signal electrodes, and extending through the filter between the top and bottom surfaces thereof, for grounding connections on such surfaces;
   applying metallization to selected regions on the top and bottom surfaces of the filter to connect respective arrays of signal electrodes and provide an interconnection surface for electrically attaching the filter to other components; and
   disposing dielectric material between the signal electrodes and ground electrodes to act as insulator material between adjacent electrodes, and so as to collectively form with the electrodes and dielectric material a filter which acts as a shielding element to prevent unwanted electromagnetic interference with the input and output of an associated implanted medical device;
   and wherein providing the signal electrodes includes providing each of said signal electrodes with a length dimension along the longitudinal axis of the filter which is less than one-half of the length of the filter along the longitudinal axis thereof, and
   wherein providing the ground electrodes includes providing each of said ground electrodes with a length dimension along the longitudinal axis of the filter which is more than one-half of the length of the filter along the longitudinal axis thereof.

19. Methodology as in claim 18, further including:
   forming a passivation layer on at least one of a top and bottom surface of the electromagnetic interference filter to prevent arcing between the plurality of signal electrode arrays; and
   grounding such ground electrodes internally and externally.

20. Methodology as in claim 18, further including:
   applying metallization to selected regions on at least one of the top, bottom and side surfaces of the filter to form an interconnection surface; and
   using such interconnection surface to electrically connect selected pluralities of electrodes of the filter to other components, wherein such connections are made using at least one of wire bonding, ball-grid array coupling, soldering, and castellation coupling.

21. An electromagnetic interference (EMI) filter as in claim 1, further including in combination therewith:
   a canister with a bushing for enclosing at least one end of such canister;
   a plurality of external connection wires passing through the bushing and coupling with an upper termination area of said EMI filter, and for connection with external circuitry of an associated implantable medical device; and
   a plurality of internal connection wires coupling with a bottom termination area of said EMI filter, and for connection with internal circuitry of an associated implantable medical device.

22. An EMI filter as in claim 21, further including bonding material securing the external connections wires in the bushing.

* * * * *